United States Patent
Minagawa

(10) Patent No.: US 11,594,873 B2
(45) Date of Patent: Feb. 28, 2023

(54) SEMICONDUCTOR DEVICE AND OVERCURRENT PROTECTION METHOD

(71) Applicant: FUJI ELECTRIC CO., LTD., Kawasaki (JP)

(72) Inventor: Kei Minagawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 38 days.

(21) Appl. No.: 17/184,816

(22) Filed: Feb. 25, 2021

(65) Prior Publication Data

US 2021/0296881 A1    Sep. 23, 2021

(30) Foreign Application Priority Data

Mar. 19, 2020 (JP) .............................. JP2020-049108

(51) Int. Cl.
*H02H 5/04* (2006.01)
*H02H 1/00* (2006.01)
*H01L 25/16* (2006.01)

(52) U.S. Cl.
CPC .......... *H02H 5/044* (2013.01); *H02H 1/0007* (2013.01); *H01L 25/162* (2013.01); *H01L 25/165* (2013.01)

(58) Field of Classification Search
CPC ....... H01L 23/34; H01L 23/62; H01L 25/072; H01L 25/162; H01L 25/165; H01L 2224/48137; H01L 2224/73265; H01L 2224/49111; H01L 2924/13091; H01L 2924/19107; H01L 2924/13055; G06F 1/26; G06F 1/28; G06F 1/206; G06F 1/30; H02H 1/0007; H02H 5/044; H03K 17/0828
(Continued)

(56) References Cited

U.S. PATENT DOCUMENTS

| 11,183,835 | B2 * | 11/2021 | Lee ...................... H02H 7/1227 |
| 2003/0173579 | A1 * | 9/2003 | Ishii ...................... H01L 25/072 257/178 |

(Continued)

FOREIGN PATENT DOCUMENTS

| JP | 2002184940 A | 6/2002 |
| JP | 2008206348 A | 9/2008 |

(Continued)

OTHER PUBLICATIONS

Machine translation of Muellmaier International Patent Document WO 2020/104281 A1 May 28, 2020 (Year: 2020).*

*Primary Examiner* — Kevin J Comber

(57) ABSTRACT

A semiconductor device includes a switching element, a control circuit, and a first and second temperature detectors. The control circuit controls the switching element and have an overcurrent detection circuit for the switching element. The first temperature detector detects the temperature of the switching element and the second temperature detector detects the temperature of the control circuit. The control circuit includes a reference correction circuit for correcting an overcurrent reference value of the overcurrent detection circuit on the basis of a first detection value and a second detection value detected by the first and second temperature detectors and outputting a corrected overcurrent reference value.

24 Claims, 22 Drawing Sheets

(58) Field of Classification Search
USPC .......................................................... 361/87
See application file for complete search history.

(56) References Cited

U.S. PATENT DOCUMENTS

| | | | | |
|---|---|---|---|---|
| 2008/0198526 A1* | 8/2008 | Hiyama | ............. | H03K 17/0828 |
| | | | | 361/93.7 |
| 2016/0372454 A1* | 12/2016 | Minagawa | .......... | H01L 27/0255 |
| 2021/0036699 A1* | 2/2021 | Lee | .................... | H03K 17/0812 |

FOREIGN PATENT DOCUMENTS

| | | | |
|---|---|---|---|
| WO | 2016039342 A1 | | 3/2016 |
| WO | WO-2020104281 A1 | * | 5/2020 |

* cited by examiner

FIG.3

| T1 \ T2 | — | 5 | 15 | 25 | 35 | 45 | 55 | 65 | 75 | 85 | 95 | 105 | 115 | 125 | 135 | 145 |
|---|---|---|---|---|---|---|---|---|---|---|---|---|---|---|---|---|
| VF1 \ VF2 | — | 1450 | 1350 | 1250 | 1150 | 1050 | 950 | 850 | 750 | 650 | 550 | 450 | 350 | 250 | 150 | 50 |
| 5 | 1450 | 0 | | | | | | | | | | | | | | |
| 15 | 1350 | -100 | 0 | | | | | | | | | | | | | |
| 25 | 1250 | -200 | -100 | 0 | | | | | | | | | | | | |
| 35 | 1150 | -300 | -200 | -100 | 0 | | | | | | | | | | | |
| 45 | 1050 | -400 | -300 | -200 | -100 | 0 | | | | | | | | | | |
| 55 | 950 | -500 | -400 | -300 | -200 | -100 | 0 | | | | | | | | | |
| 65 | 850 | -600 | -500 | -400 | -300 | -200 | -100 | 0 | | | | | | | | |
| 75 | 750 | -700 | -600 | -500 | -400 | -300 | -200 | -100 | 0 | | | | | | | |
| 85 | 650 | -800 | -700 | -600 | -500 | -400 | -300 | -200 | -100 | 0 | | | | | | |
| 95 | 550 | -900 | -800 | -700 | -600 | -500 | -400 | -300 | -200 | -100 | 0 | | | | | |
| 105 | 450 | -1000 | -900 | -800 | -700 | -600 | -500 | -400 | -300 | -200 | -100 | 0 | | | | |
| 115 | 350 | -1100 | -1000 | -900 | -800 | -700 | -600 | -500 | -400 | -300 | -200 | -100 | 0 | | | |
| 125 | 250 | -1200 | -1100 | -1000 | -900 | -800 | -700 | -600 | -500 | -400 | -300 | -200 | -100 | 0 | | |
| 135 | 150 | -1300 | -1200 | -1100 | -1000 | -900 | -800 | -700 | -600 | -500 | -400 | -300 | -200 | -100 | 0 | |
| 145 | 50 | -1400 | -1300 | -1200 | -1100 | -1000 | -900 | -800 | -700 | -600 | -500 | -400 | -300 | -200 | -100 | 0 |

FIG.4

| T1\T2 | | 5 | 15 | 25 | 35 | 45 | 55 | 65 | 75 | 85 | 95 | 105 | 115 | 125 | 135 | 145 |
|---|---|---|---|---|---|---|---|---|---|---|---|---|---|---|---|---|
| | VF2 | 1450 | 1350 | 1250 | 1150 | 1050 | 950 | 850 | 750 | 650 | 550 | 450 | 350 | 250 | 150 | 50 |
| VF1 | VOCa | 40 | 120 | 200 | 280 | 360 | 440 | 520 | 600 | 680 | 760 | 840 | 920 | 1000 | 1080 | 1160 |
| 5 | 1450 | 40 | | | | | | | | | | | | | | |
| 15 | 1350 | 140 | 120 | | | | | | | | | | | | | |
| 25 | 1250 | 240 | 220 | 200 | | | | | | | | | | | | |
| 35 | 1150 | 340 | 320 | 300 | 280 | | | | | | | | | | | |
| 45 | 1050 | 440 | 420 | 400 | 380 | 360 | | | | | | | | | | |
| 55 | 950 | 540 | 520 | 500 | 480 | 460 | 440 | | | | | | | | | |
| 65 | 850 | 640 | 620 | 600 | 580 | 560 | 540 | 520 | | | | | | | | |
| 75 | 750 | 740 | 720 | 700 | 680 | 660 | 640 | 620 | 600 | | | | | | | |
| 85 | 650 | 840 | 820 | 800 | 780 | 760 | 740 | 720 | 700 | 680 | | | | | | |
| 95 | 550 | 940 | 920 | 900 | 880 | 860 | 840 | 820 | 800 | 780 | 760 | | | | | |
| 105 | 450 | 1040 | 1020 | 1000 | 980 | 960 | 940 | 920 | 900 | 880 | 860 | 840 | | | | |
| 115 | 350 | 1140 | 1120 | 1100 | 1080 | 1060 | 1040 | 1020 | 1000 | 980 | 960 | 940 | 920 | | | |
| 125 | 250 | 1240 | 1220 | 1200 | 1180 | 1160 | 1140 | 1120 | 1100 | 1080 | 1060 | 1040 | 1020 | 1000 | | |
| 135 | 150 | 1340 | 1320 | 1300 | 1280 | 1260 | 1240 | 1220 | 1200 | 1180 | 1160 | 1140 | 1120 | 1100 | 1080 | |
| 145 | 50 | 1440 | 1420 | 1400 | 1380 | 1360 | 1340 | 1320 | 1300 | 1280 | 1260 | 1240 | 1220 | 1200 | 1180 | 1160 |

FIG.7

| T' | VF1 | VF1a | T2→ 5 | 15 | 25 | 35 | 45 | 55 | 65 | 75 | 85 | 95 | 105 | 115 | 125 | 135 | 145 |
|---|---|---|---|---|---|---|---|---|---|---|---|---|---|---|---|---|---|
|  |  | VF2→ | 1450 | 1350 | 1250 | 1150 | 1050 | 950 | 850 | 750 | 650 | 550 | 450 | 350 | 250 | 150 | 50 |
| 5 | 1450 | 1250 | -200 |  |  |  |  |  |  |  |  |  |  |  |  |  |  |
| 15 | 1350 | 1250 | -200 | -100 |  |  |  |  |  |  |  |  |  |  |  |  |  |
| 25 | 1250 | 1250 | -200 | -100 | 0 |  |  |  |  |  |  |  |  |  |  |  |  |
| 35 | 1150 | 1250 | -200 | -100 | 0 | 100 |  |  |  |  |  |  |  |  |  |  |  |
| 45 | 1050 | 1250 | -200 | -100 | 0 | 100 | 200 |  |  |  |  |  |  |  |  |  |  |
| 55 | 950 | 750 | -700 | -600 | -500 | -400 | -300 | -200 |  |  |  |  |  |  |  |  |  |
| 65 | 850 | 750 | -700 | -600 | -500 | -400 | -300 | -200 | -100 |  |  |  |  |  |  |  |  |
| 75 | 750 | 750 | -700 | -600 | -500 | -400 | -300 | -200 | -100 | 0 |  |  |  |  |  |  |  |
| 85 | 650 | 750 | -700 | -600 | -500 | -400 | -300 | -200 | -100 | 0 | 100 |  |  |  |  |  |  |
| 95 | 550 | 750 | -700 | -600 | -500 | -400 | -300 | -200 | -100 | 0 | 100 | 200 |  |  |  |  |  |
| 105 | 450 | 250 | -1200 | -1100 | -1000 | -900 | -800 | -700 | -600 | -500 | -400 | -300 | -200 |  |  |  |  |
| 115 | 350 | 250 | -1200 | -1100 | -1000 | -900 | -800 | -700 | -600 | -500 | -400 | -300 | -200 | -100 |  |  |  |
| 125 | 250 | 250 | -1200 | -1100 | -1000 | -900 | -800 | -700 | -600 | -500 | -400 | -300 | -200 | -100 | 0 |  |  |
| 135 | 150 | 250 | -1200 | -1100 | -1000 | -900 | -800 | -700 | -600 | -500 | -400 | -300 | -200 | -100 | 0 | 100 |  |
| 145 | 50 | 250 | -1200 | -1100 | -1000 | -900 | -800 | -700 | -600 | -500 | -400 | -300 | -200 | -100 | 0 | 100 | 200 |

FIG.8

| T1 \ T2 | VF1 | Vf1a / VOCo | 5 / VF2 | 15 | 25 | 35 | 45 | 55 | 65 | 75 | 85 | 95 | 105 | 115 | 125 | 135 | 145 |
|---|---|---|---|---|---|---|---|---|---|---|---|---|---|---|---|---|---|
| | | | 1450 | 1350 | 1250 | 1150 | 1050 | 950 | 850 | 750 | 650 | 550 | 450 | 350 | 250 | 150 | 50 |
| | | | 40 | 120 | 200 | 280 | 360 | 440 | 520 | 600 | 680 | 760 | 840 | 920 | 1000 | 1080 | 1160 |
| 5 | 1450 | 1250 | 240 | | | | | | | | | | | | | | |
| 15 | 1350 | 1250 | 240 | 220 | | | | | | | | | | | | | |
| 25 | 1250 | 1250 | 240 | 220 | 200 | | | | | | | | | | | | |
| 35 | 1150 | 1250 | 240 | 220 | 200 | 180 | | | | | | | | | | | |
| 45 | 1050 | 1250 | 240 | 220 | 200 | 180 | 160 | | | | | | | | | | |
| 55 | 950 | 750 | 740 | 720 | 700 | 680 | 660 | 640 | | | | | | | | | |
| 65 | 850 | 750 | 740 | 720 | 700 | 680 | 660 | 640 | 620 | | | | | | | | |
| 75 | 750 | 750 | 740 | 720 | 700 | 680 | 660 | 640 | 620 | 600 | | | | | | | |
| 85 | 650 | 750 | 740 | 720 | 700 | 680 | 660 | 640 | 620 | 600 | 580 | | | | | | |
| 95 | 550 | 750 | 740 | 720 | 700 | 680 | 660 | 640 | 620 | 600 | 580 | 560 | | | | | |
| 105 | 450 | 250 | 1240 | 1220 | 1200 | 1180 | 1160 | 1140 | 1120 | 1100 | 1080 | 1060 | 1040 | | | | |
| 115 | 350 | 250 | 1240 | 1220 | 1200 | 1180 | 1160 | 1140 | 1120 | 1100 | 1080 | 1060 | 1040 | 1020 | | | |
| 125 | 250 | 250 | 1240 | 1220 | 1200 | 1180 | 1160 | 1140 | 1120 | 1100 | 1080 | 1060 | 1040 | 1020 | 1000 | | |
| 135 | 150 | 250 | 1240 | 1220 | 1200 | 1180 | 1160 | 1140 | 1120 | 1100 | 1080 | 1060 | 1040 | 1020 | 1000 | 980 | |
| 145 | 50 | 250 | 1240 | 1220 | 1200 | 1180 | 1160 | 1140 | 1120 | 1100 | 1080 | 1060 | 1040 | 1020 | 1000 | 980 | 960 |

FIG.11

| T1\T2 |  | 5 | 15 | 25 | 35 | 45 | 55 | 65 | 75 | 85 | 95 | 105 | 115 | 125 | 135 | 145 |
|---|---|---|---|---|---|---|---|---|---|---|---|---|---|---|---|---|
|  | VF2 | 1450 | 1350 | 1250 | 1150 | 1050 | 950 | 850 | 750 | 650 | 550 | 450 | 350 | 250 | 150 | 50 |
| VF1 |  |  |  |  |  |  |  |  |  |  |  |  |  |  |  |  |
| 5 | 1450 | 0 | 100 | 200 | 300 | 400 | 500 | 600 | 700 | 800 | 900 | 1000 | 1100 | 1200 | 1300 | 1400 |
| 15 | 1350 | -100 | 0 | 100 | 200 | 300 | 400 | 500 | 600 | 700 | 800 | 900 | 1000 | 1100 | 1200 | 1300 |
| 25 | 1250 | -200 | -100 | 0 | 100 | 200 | 300 | 400 | 500 | 600 | 700 | 800 | 900 | 1000 | 1100 | 1200 |
| 35 | 1150 | -300 | -200 | -100 | 0 | 100 | 200 | 300 | 400 | 500 | 600 | 700 | 800 | 900 | 1000 | 1100 |
| 45 | 1050 | -400 | -300 | -200 | -100 | 0 | 100 | 200 | 300 | 400 | 500 | 600 | 700 | 800 | 900 | 1000 |
| 55 | 950 | -500 | -400 | -300 | -200 | -100 | 0 | 100 | 200 | 300 | 400 | 500 | 600 | 700 | 800 | 900 |
| 65 | 850 | -600 | -500 | -400 | -300 | -200 | -100 | 0 | 100 | 200 | 300 | 400 | 500 | 600 | 700 | 800 |
| 75 | 750 | -700 | -600 | -500 | -400 | -300 | -200 | -100 | 0 | 100 | 200 | 300 | 400 | 500 | 600 | 700 |
| 85 | 650 | -800 | -700 | -600 | -500 | -400 | -300 | -200 | -100 | 0 | 100 | 200 | 300 | 400 | 500 | 600 |
| 95 | 550 | -900 | -800 | -700 | -600 | -500 | -400 | -300 | -200 | -100 | 0 | 100 | 200 | 300 | 400 | 500 |
| 105 | 450 | -1000 | -900 | -800 | -700 | -600 | -500 | -400 | -300 | -200 | -100 | 0 | 100 | 200 | 300 | 400 |
| 115 | 350 | -1100 | -1000 | -900 | -800 | -700 | -600 | -500 | -400 | -300 | -200 | -100 | 0 | 100 | 200 | 300 |
| 125 | 250 | -1200 | -1100 | -1000 | -900 | -800 | -700 | -600 | -500 | -400 | -300 | -200 | -100 | 0 | 100 | 200 |
| 135 | 150 | -1300 | -1200 | -1100 | -1000 | -900 | -800 | -700 | -600 | -500 | -400 | -300 | -200 | -100 | 0 | 100 |
| 145 | 50 | -1400 | -1300 | -1200 | -1100 | -1000 | -900 | -800 | -700 | -600 | -500 | -400 | -300 | -200 | -100 | 0 |

FIG.12

| T1 | VF1 | VOCo | T2=5 | 15 | 25 | 35 | 45 | 55 | 65 | 75 | 85 | 95 | 105 | 115 | 125 | 135 | 145 |
|---|---|---|---|---|---|---|---|---|---|---|---|---|---|---|---|---|---|
|  |  | VF2= | 1450 | 1350 | 1250 | 1150 | 1050 | 950 | 850 | 750 | 650 | 550 | 450 | 350 | 250 | 150 | 50 |
| 5 | 1450 | 40 | 40 | 120 | 200 | 280 | 360 | 440 | 520 | 600 | 680 | 760 | 840 | 920 | 1000 | 1080 | 1160 |
| 15 | 1350 | 140 | 20 | 120 | 200 | 280 | 360 | 440 | 520 | 600 | 680 | 760 | 840 | 920 | 1000 | 1080 | 1160 | 1150 |
| 25 | 1250 | 240 | 0 | 100 | 200 | 280 | 360 | 440 | 520 | 600 | 680 | 760 | 840 | 920 | 1000 | 1080 | 1160 |
| 35 | 1150 | 340 | −20 | 80 | 180 | 280 | 360 | 440 | 520 | 600 | 680 | 760 | 840 | 920 | 1000 | 1080 | 1160 |
| 45 | 1050 | 440 | −40 | 60 | 160 | 260 | 360 | 440 | 520 | 600 | 680 | 760 | 840 | 920 | 1000 | 1080 | 1160 |
| 55 | 950 | 540 | −60 | 40 | 140 | 240 | 340 | 440 | 520 | 600 | 680 | 760 | 840 | 920 | 1000 | 1080 | 1160 |
| 65 | 850 | 640 | −80 | 20 | 120 | 220 | 320 | 420 | 520 | 600 | 680 | 760 | 840 | 920 | 1000 | 1080 | 1160 |
| 75 | 750 | 740 | −100 | 0 | 100 | 200 | 300 | 400 | 500 | 600 | 680 | 760 | 840 | 920 | 1000 | 1080 | 1160 |
| 85 | 650 | 840 | −120 | −20 | 80 | 180 | 280 | 380 | 480 | 580 | 680 | 760 | 840 | 920 | 1000 | 1080 | 1160 |
| 95 | 550 | 940 | −140 | −40 | 60 | 160 | 260 | 360 | 460 | 560 | 660 | 760 | 840 | 920 | 1000 | 1080 | 1160 |
| 105 | 450 | 1040 | −160 | −60 | 40 | 140 | 240 | 340 | 440 | 540 | 640 | 740 | 840 | 920 | 1000 | 1080 | 1160 |
| 115 | 350 | 1140 | −180 | −80 | 20 | 120 | 220 | 320 | 420 | 520 | 620 | 720 | 820 | 920 | 1000 | 1080 | 1160 |
| 125 | 250 | 1240 | −200 | −100 | 0 | 100 | 200 | 300 | 400 | 500 | 600 | 700 | 800 | 900 | 1000 | 1080 | 1160 |
| 135 | 150 | 1340 | −220 | −120 | −20 | 80 | 180 | 280 | 380 | 480 | 580 | 680 | 780 | 880 | 980 | 1080 | 1160 |
| 145 | 50 | 1440 | −240 | −140 | −40 | 60 | 160 | 260 | 360 | 460 | 560 | 660 | 760 | 860 | 960 | 1060 | 1160 |

SEMICONDUCTOR DEVICE AND OVERCURRENT PROTECTION METHOD

CROSS-REFERENCE TO RELATED APPLICATIONS

The present application claims priority from Japanese Patent Application No. 2020-049108, filed Mar. 19, 2020, the entire content of which is incorporated herein by reference.

TECHNICAL FIELD

The present invention relates to a power semiconductor device, and more particularly to a protection method of a module having a control circuit and a switching element such as an IGBT.

BACKGROUND ART

In the related art, configurations obtained by modularizing power switching elements such as insulated gate bipolar transistors (IGBTs) and metal-oxide-semiconductor field-effect transistors (MOSFETs) (hereinafter, referred to as switching element modules) have been known.

Such switching element modules have various protection methods (protection functions), and as one of such methods (functions), an overcurrent protection method is provided.

The overcurrent protection method includes at least a diode for chip temperature detection attached to a switching element and an IC for performing a protection operation as components. The diode for chip temperature detection may be integrated with the switching element (see Patent Literature 1 for instance), or may be provided on the same circuit board separately from the switching element or be provided together with the switching element in the same resin case (see the second embodiment of Patent Literature 2 for instance, and this is shown in FIG. 24 of this specification). Herein, a circuit board is an insulating substrate having a predetermined circuit pattern and having electronic components mounted thereon.

FIG. 18 is a view illustrating an example of the internal configuration of an intelligent power module (IPM) of the related art which is a kind of switching element module.

In an IPM 300 shown in FIG. 18, an inverter for outputting three-phase AC voltage is configured. Therefore, the IPM 300 has a positive power supply terminal P, a negative power supply terminal N, and output terminals U, V, and W, and includes six IGBTs 301 to 306. The IGBTs 301 to 306 are connected in reverse parallel by protective diodes 311 to 316 mounted on the same circuit pattern, respectively. Between the positive power supply terminal P and the negative power supply terminal N, the IGBT 301 the IGBT 303, and the IGBT 305 are connected in series with the IGBT 302, the IGBT 304, and the IGBT 306, respectively, so as to form three sets of arm parts. Further, the intermediate connection parts of the individual arm parts for U, V, and W phases are connected to the output terminals U, V, and W, respectively (Patent Literature 1).

The IGBTs 301 to 306 have temperature detection diodes having p-n junctions on the centers of their front surfaces (emitter terminals) with insulating layers interposed therebetween. As a result, each of the IGBTs 301 to 306 can observe the chip temperature close to the junction temperature by monitoring the forward voltage depending on the temperature of the temperature detection diode.

Furthermore, the gate terminals and the temperature detection diodes of the IGBTs 301 to 306 are connected to control ICs 321 to 326. The control ICs 321 to 326 perform switching control on the IGBTs 301 to 306, and apply constant currents to the temperature detection diodes, thereby detecting overheat conditions of the IGBTs 301 to 306.

FIGS. 19 to 24 show semiconductor element modules which are a kind of switching element modules, and module units each of which includes a plurality of such semiconductor element modules. FIG. 19 is a bird's eye view of the internal structure of a semiconductor element module 500. On an insulating substrate 403 provided on a bottom metal substrate 409, an emitter pattern 404 and a collector pattern 405 are provided, and on them, an IGBT 401 and a diode element 402 are further provided, and the IGBT is electrically coupled with a gate pattern 406 and a control emitter pattern 408 by metal wires 407 such that the gate pattern 406 and the control emitter pattern 408 are connected to a gate terminal 413 and a control emitter terminal 414. FIG. 20 is a view illustrating the semiconductor element module 500 as seen from above, and FIG. 21 is a side view of FIG. 20 as seen from an arrow A. FIGS. 20 and 21 show that the internal structure shown in FIG. 19 has been formed in a resin case 410, and a main emitter terminal 411, a main collector terminal 412, and so on have been provided on the emitter pattern 404 and the collector pattern 405. FIG. 22 is a view illustrating a module unit having eight semiconductor element modules 500, and FIG. 23 is a side view of FIG. 22 as seen from an arrow B. Although IGBTs 401, the semiconductor element modules 500 including them, and a control board 420 exist, the control board 420 is mounted outside the semiconductor element modules 500. Reference symbols "501" and "502" indicate the unit frame. FIG. 24 shows the second embodiment in which a thermistor 432 for detecting the temperature in a semiconductor element module 600 has been provided on an intermediate insulating substrate 431 and is covered with a resin case (Patent Literature 2).

In the following description of the drawings, identical or similar parts are denoted by the same or similar reference symbols. Further, the maximum value and minimum value of operating temperature assumed for a power semiconductor device are denoted by TH and TL.

In FIG. 13, an example of a power semiconductor device of the related art is shown. The power semiconductor device includes a control circuit 1, a switching element 2, and a diode 8 for switching-element temperature detection. The control circuit 1 includes an overcurrent reference voltage circuit 5a, an overcurrent detection comparator 6, a sense voltage detection resistor 7, an overheat detection comparator 9, an overheat reference voltage circuit 10, and a filter 13.

The control circuit 1 is connected to the switching element 2 as shown in FIG. 13. In other words, the control circuit 1 has an output terminal OUT for outputting a gate voltage, an overcurrent detection terminal OC, and an overheat detection terminal OH.

The output terminal OUT is connected to the gate terminal of the switching element 2, and the overcurrent detection terminal OC is connected to the emitter terminal of the switching element 2 for current sensing. The emitter terminal of the switching element 2 is connected to ground potential.

In the control circuit 1, the overheat detection terminal OH is connected to a constant-current source 11 and the inverting input terminal of the overheat detection comparator 9, and the non-inverting input terminal of the overheat detection comparator 9 is connected to the overheat reference voltage circuit 10. The overheat detection terminal OH is connected to the anode terminal of the diode 8 for switching-element temperature detection, and the cathode terminal of the diode 8 for switching-element temperature detection is connected to ground potential.

A constant current produced by the constant-current source 11 always flows into the diode 8 for switching-element temperature detection, so forward voltage corresponding to the chip temperature of the switching element 2 is applied to the inverting input terminal of the overheat detection comparator 9. Herein, it is assumed that the diode 8 for switching-element temperature detection has a negative temperature characteristic, and the overheat reference voltage circuit 10 outputs an overheat reference voltage VOH1 corresponding to the temperature TH. In this case, the overheat detection comparator 9 outputs a low-level protection operation signal when the chip temperature is lower than TH, and outputs a high-level protection operation signal if the chip temperature becomes a temperature equal to or higher than TH. If this high-level protection operation signal is output, the control circuit 1 outputs an alarm signal from an alarm output circuit and simultaneously performs control to turn off the switching element 2.

In the control circuit 1, the overcurrent detection terminal OC is connected to the sense voltage detection resistor 7 and the inverting input terminal of the overcurrent detection comparator 6, and the non-inverting input terminal of the overcurrent detection comparator 6 is connected to the overcurrent reference voltage circuit 5a. The output part of the overcurrent detection comparator 6 is connected to the input part of the filter 13, such that voltages other than a voltage proportional to the collector current are removed.

In general, as an overcurrent detecting method, a method of shunting a current of about one ten thousandth of the emitter current in the switching element 2, and comparing a voltage (sense voltage) which is obtained when the corresponding current flows in the sense voltage detection resistor 7 with an overcurrent reference voltage VOC which is generated in the overcurrent reference voltage circuit 5a of the overcurrent detection comparator 6, thereby detecting the current, and determining the magnitude of the current on the basis of the magnitude of the sense voltage, and performing alarm output and gate shut-off by a logic circuit for protection operation signal transmission is known.

In FIG. 15, a condition for overcurrent detection/determination is shown. The relation between collector current and sense voltage is a relation in which the sense voltage becomes higher as the collector current increases as shown by a line 201, and when the sense voltage is compared with a predetermined reference voltage value VB, if the sense voltage exceeds the reference voltage value, the collector current is regarded as exceeding the collector current value IC of the intersection of the predetermined reference voltage and the above-mentioned line, and is determined as being an overcurrent.

The sense voltage becomes higher as the temperature of the switching element 2 rises, and the current detection voltage becomes higher as the temperature of the control circuit rises.

In FIG. 16, an overcurrent protection operation of a power semiconductor device of the related art is shown. A reference symbol "202" indicates sense voltage when the temperature is TH, and a reference symbol "204" indicates sense voltage when the temperature is TL. Further, a reference symbol "VBH" indicates reference voltage when the temperatures are TH, and a reference symbol "VBL" indicates reference voltage when the temperatures are TL.

In general, the temperatures of the switching element and the control circuit are almost the same, or the temperature of the switching element is slightly higher.

Therefore, as shown in FIG. 16, when both temperatures are TH, the sense voltage is represented by the line 202, and the reference voltage is VBH. Therefore, an overcurrent detection value becomes the intersection 203 of them, and a range equal to or higher than a collector current ICTH becomes an overcurrent protection range. When both temperatures are TL, the sense voltage is represented by the line 204, and the reference voltage is VBL. Therefore, an overcurrent detection value becomes the intersection 205 of them, and a range equal to or higher than a collector current ICTL becomes an overcurrent protection range.

[Patent Literature 1] WO 2016/039342
[Patent Literature 2] JP2002-184940A

The case where the temperature of the switching element and the temperature of the control circuit are extremely different may occur. Especially, in the case where the control circuit is provided outside the switching element as disclosed in Patent Literature 2, heat generated on one side may not be sufficiently transmitted to the other side, so such a case may occur.

In the case where the temperature of the switching element is extremely higher than the temperature of the control circuit, an overcurrent detection value which is calculated in the related art becomes a value lower than a value originally required, so excessive protection is performed.

For example, in the case where the temperature of the switching element is TH, and the temperature of the control circuit is TL, the intersection 206 of the sense voltage 202 and the reference voltage VBL becomes an overcurrent value, and a range equal to or higher than a collector current ICmin becomes an overcurrent protection range. However, when the temperature of the switching element is taken into consideration, originally, a range equal to or higher than ICTH is an overcurrent protection range, and when the collector current is between ICmin and ICTH, originally unnecessary protection is performed.

Therefore, in the related art, the overcurrent protection range has a redundant region 207.

SUMMARY

The present invention was made in view of the above-mentioned problem, and an object of the present invention is to provide a semiconductor device with a high-accuracy switching element protection function and a protection method thereof.

In order to achieve the object, the gist of the present invention is to provide a switching element, a control circuit configured to control the switching element and have an overcurrent protection method, and individual temperature detector for the switching element and the control circuit, and correct an overcurrent detection reference on the basis of two detection values detected by both temperature detector.

The switching element may be mounted on a circuit board which is formed of an insulating substrate having a predetermined circuit pattern and having electronic components mounted thereon, and the control circuit may be mounted on another circuit board which is formed of an insulating substrate having a predetermined circuit pattern and having electronic components mounted thereon. The switching element and the control circuit may be mounted on the same circuit board.

For the switching element, a resin case may be formed so as to cover it, and for the control circuit, another resin case is formed so as to cover it. The switching element and the control circuit may be mounted in the same resin case.

The temperature detector for the switching element is provided in the same element, or on the circuit board where the switching element is mounted, or in the resin case where the switching element is stored, or in the vicinity thereof where it can measure the temperature of the switching element.

Further, the temperature detector for the control circuit is provided in the same control circuit, or on the circuit board where the control circuit is mounted, or in the resin case where the control circuit is stored, or in the vicinity thereof where it can measure the temperature of the control circuit.

As the switching element, a MOSFET or an IGBT may be used, and as the temperature detector, diodes may be used.

In the case of using means having negative temperature characteristics like diodes as the temperature detector, the circuit for correcting an overcurrent detection reference may determine a detection voltage obtained by the temperature detector for the switching element in a plurality of stages, and set a corrected voltage in the same number of stages, thereby performing conversion into an output voltage having the reversed magnitude relation with respect to the detection voltage, and output a value calculated on the basis of the sum of the output voltage and the detection voltage obtained by the temperature detector for the control circuit, as an overcurrent detection reference value.

Also, in the case of using means having positive temperature characteristics as the temperature detector, the circuit for correcting an overcurrent detection reference may determine a detection voltage obtained by the temperature detector for the control circuit in a plurality of stages, and set a corrected voltage in the same number of stages, thereby performing conversion into an output voltage having the reversed magnitude relation with respect to the detection voltage, and output a value calculated on the basis of the sum of the output voltage and a detection voltage obtained by the temperature detector for the switching element, as an overcurrent detection reference value.

Also, in the case of using means having negative temperature characteristics as the temperature detector for the switching element and the control circuit, the circuit for correcting an overcurrent detection reference may perform conversion into an output voltage having the reversed magnitude relation with respect to a detection voltage obtained by the temperature detector for the switching element, and output a value calculated on the basis of the sum of the output voltage and a detection voltage obtained by the temperature detector for the control circuit, as an overcurrent detection reference value.

Also, in the case of using means having positive temperature characteristics as the temperature detector for the switching element and the control circuit, the circuit for correcting an overcurrent detection reference may perform conversion into an output voltage having the reversed magnitude relation with respect to a detection voltage obtained by the temperature detector for the control circuit, and output a value calculated on the basis of the sum of the output voltage and a detection voltage obtained by the temperature detection means for the switching element, as an overcurrent detection reference value.

Also, in the case of using a means having a positive temperature characteristic and a means having a negative temperature characteristic as the temperature detector for the switching element and the temperature detector for the control circuit, respectively, the circuit for correcting an overcurrent detection reference may output a value calculated on the basis of the sum of detection voltages obtained by both temperature detectors, as an overcurrent detection reference value.

According to the present invention, by correcting an overcurrent protection detection level, it is possible to reduce a redundant region of overcurrent protection current, and it is possible to improve the accuracy of the overcurrent protection method.

BRIEF DESCRIPTION OF DRAWINGS

FIG. 3 is a view illustrating an example of the relation between T1 and T2, and inputs VF1, VF2, and correction values VOCa in the first example of the overcurrent reference voltage correction circuit of the present invention.

FIG. 4 is a view illustrating an example of the relation between T1 and T2, and inputs VF1, VF2, uncorrected reference voltages VOCo, and outputs VOC in the first example of the overcurrent reference voltage correction circuit of the present invention.

FIG. 7 is a view illustrating an example of the relation between T1 and T2, and inputs VF1, VF2, and correction values VOCa in the third example of the overcurrent reference voltage correction circuit of the present invention.

FIG. 8 is a view illustrating an example of the relation between T1 and T2, and inputs VF1, VF2, uncorrected reference voltages VOCo, and outputs VOC in the third example of the overcurrent reference voltage correction circuit of the present invention.

FIG. 11 is a view illustrating an expansion of the outputs of the drawing (FIG. 3) illustrating the example of the relation between T1 and T2, and inputs VF1 and VF2 and correction values VOCa in the first example of the overcurrent reference voltage correction circuit of the present invention to a range in which T2 is higher than T1.

FIG. 12 is a view illustrating an expansion of the outputs of the drawing (FIG. 4) illustrating the example of the relation between T1 and T2, and inputs VF1 and VF2, the uncorrected reference voltages VOCo, and outputs VOC in the first example of the overcurrent reference voltage correction circuit of the present invention to a range in which T2 is higher than T1.

DESCRIPTION OF EMBODIMENTS

Figure 1:
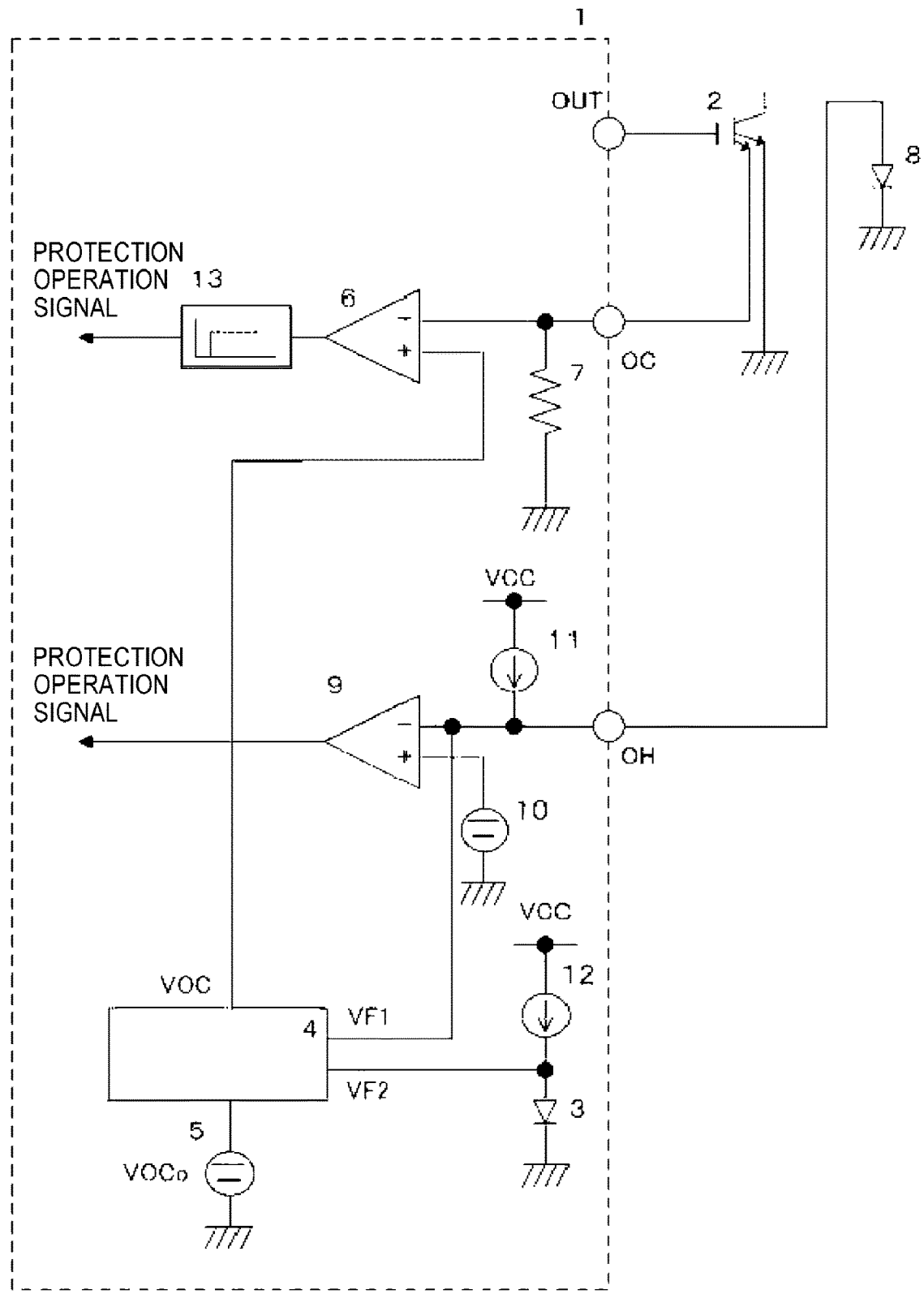
FIG. 1 is a block diagram illustrating a first embodiment of a power semiconductor device according to the present invention.

A first embodiment of power semiconductor devices according to embodiments of the present invention includes a control circuit 1, a switching element 2, and a diode 8 for switching-element temperature detection as shown in FIG. 1. In the present embodiment, an example in which an IGBT is used as the switching element 2 is shown. The diode 8 for switching-element temperature detection may be built in the switching element 2. In the case where the switching element 2 is an IGBT, it is formed of polysilicon on the center of a front surface (an emitter terminal) with an insulating film interposed therebetween. Alternatively, the diode 8 for switching-element temperature detection may be disposed at a position where it can measure the temperature of the switching element 2, separately from the switching element 2. For example, the diode may be mounted on a circuit board where the switching element 2 is mounted, or may be disposed together with the switching element 2 in the same resin case, or may be disposed in the vicinity of the resin case where the switching element 2 is formed. Herein, the circuit board is an insulating board having a predetermined circuit pattern.

The control circuit 1 includes a diode 3 for control circuit temperature detection, an overcurrent reference voltage correction circuit 4, an overcurrent reference voltage circuit 5, an overcurrent detection comparator 6, a sense voltage detection resistor 7, an overheat detection comparator 9, an overheat reference voltage circuit 10, constant-current sources 11 and 12, and a filter 13. The control circuit 1 and the diode 3 for control circuit temperature detection may be integrated in the same semiconductor substrate. For example, they are formed of polysilicon on a semiconductor substrate with an insulating film interposed therebetween. Alternatively, the diode 3 for temperature detection may be disposed at a position where it can measure the temperature of the control circuit 1, separately from the control circuit 1. For example, the diode may be mounted on a circuit board where the control circuit 1 is mounted, or may be disposed together with the control circuit 1 in the same resin case, or may be disposed in the vicinity of the resin case where the control circuit 1 is formed.

The control circuit 1 is connected to the switching element 2 as shown in FIG. 1. The switching element 2 includes a current sensing element arranged in parallel to an IGBT through which a main current flows. The control circuit 1 has an output terminal OUT for outputting a gate voltage, an overcurrent detection terminal OC, and an overheat detection terminal OH. Further, the control circuit 1 and the switching element 2 include the diode 3 for control circuit temperature detection and the diode 8 for switching-element temperature detection, and may be provided in the same circuit board, or may be provided in the same resin case, or may be formed separately.

The output terminal OUT is connected to the gate terminal of the switching element 2, and the overcurrent detection terminal OC is connected to the current sensing terminal of the current sensing element of the switching element 2. The emitter terminal of the switching element 2 is connected to ground potential.

In the control circuit 1, the overheat detection terminal OH is connected to the constant-current source 11, the inverting input terminal of the overheat detection comparator 9, and the overcurrent reference voltage correction circuit 4, and the non-inverting input terminal of the overheat detection comparator 9 is connected to the overheat reference voltage circuit 10. The overheat detection terminal OH is connected to the anode terminal of the diode 8 for switching-element temperature detection, and the cathode terminal of the diode 8 for switching-element temperature detection is connected to the ground potential of the control circuit 1.

A constant current produced by the constant-current source 11 always flows into the diode 8 for switching-element temperature detection, so forward voltage corresponding to the chip temperature of the switching element 2 is applied to the inverting input terminal of the overheat detection comparator 9. Herein, it is assumed that the diode 8 for switching-element temperature detection has a negative temperature characteristic, and the overheat reference voltage circuit 10 outputs an overheat reference voltage VOH1 corresponding to the temperature TH. In this case, the overheat detection comparator 9 outputs a low-level protection operation signal when the chip temperature is lower than TH, and outputs a high-level protection operation signal if the chip temperature becomes a temperature equal to or higher than TH. If this high-level protection operation signal is output, the control circuit 1 outputs an alarm signal from an alarm output circuit and simultaneously performs control to turn off the switching element 2.

In the control circuit 1, the overcurrent detection terminal OC is connected to the sense voltage detection resistor 7 and the inverting input terminal of the overcurrent detection comparator 6, and the non-inverting input terminal of the overcurrent detection comparator 6 is connected to the overcurrent reference voltage correction circuit 4. The output part of the overcurrent detection comparator 6 is connected to the input part of the filter 13, such that voltages other than a voltage proportional to the collector current is removed.

A constant current produced by the constant-current source 12 always flows into the diode 3 for control circuit temperature detection, so forward voltage corresponding to the temperature of the control circuit 1 is applied as VF2 to the overcurrent reference voltage correction circuit 4.

The overcurrent reference voltage correction circuit 4 calculates a correction value VOCa for correcting an overcurrent reference voltage VOCo to be output from the overcurrent reference voltage circuit 5, on the basis of a signal VF1 obtained by the diode 8 for switching-element temperature detection and a signal VF2 obtained by the above-mentioned diode 3 for control circuit temperature detection, and transmits a corrected overcurrent reference voltage VOC to the non-inverting input of the comparator 6.

The overcurrent detection comparator 6 compares a sense voltage which is obtained when a current of about one ten thousandth of the emitter current of the switching element 2 is shunted and the corresponding current flows in the sense voltage detection resistor 7 with the overcurrent reference voltage VOC, and transmits a protection operation signal.

Figure 14:
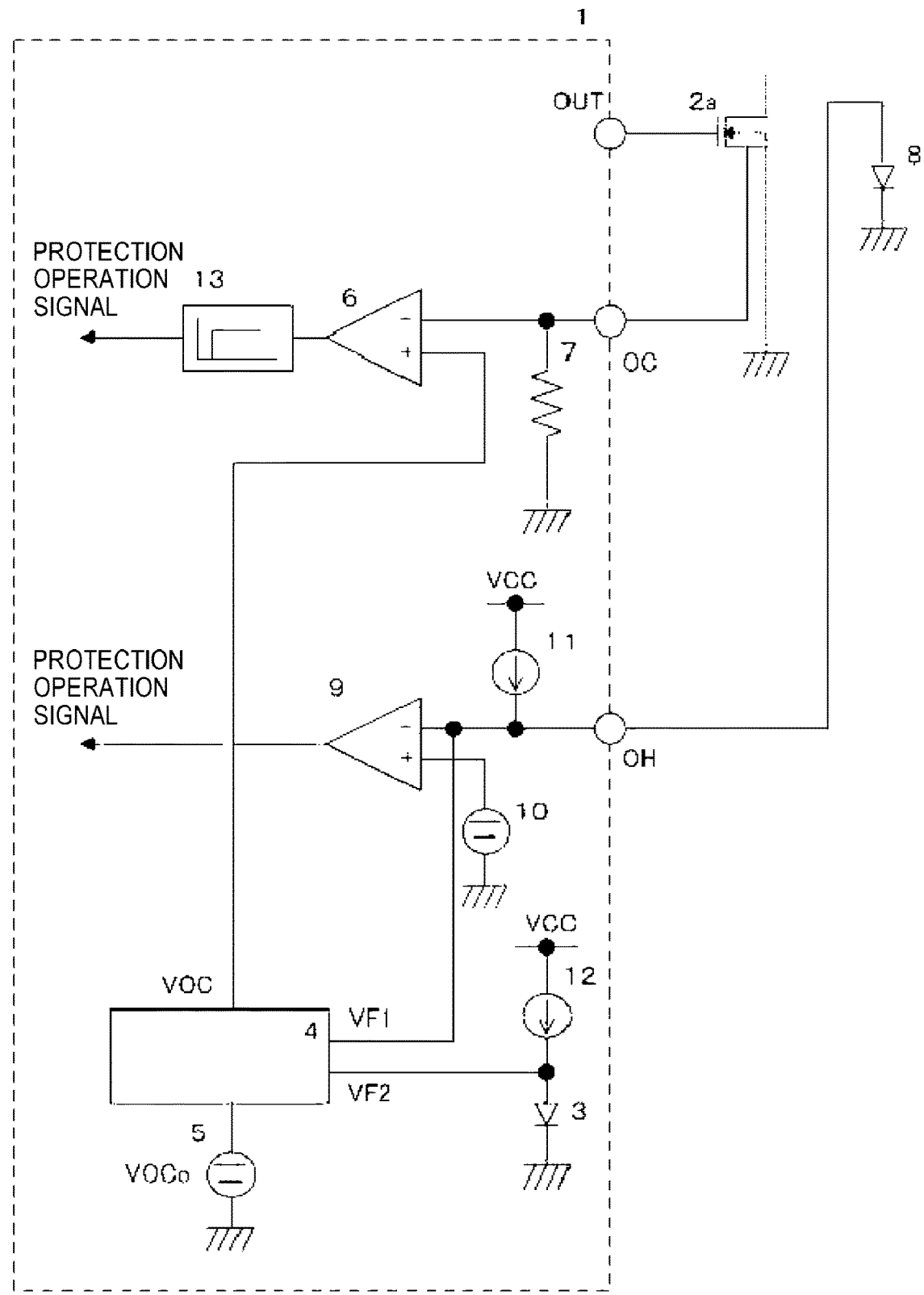
FIG. 14 is a block diagram illustrating a second embodiment of the power semiconductor device according to the present invention.
Figure 15:
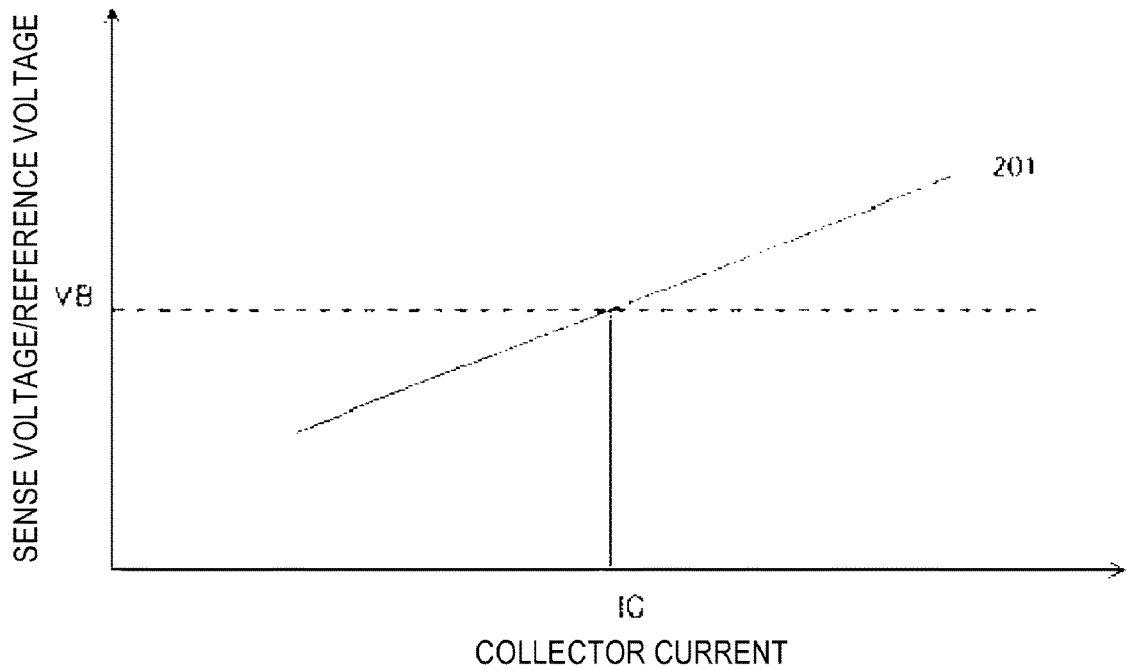
FIG. 15 is a view illustrating an overcurrent protection operation region of the power semiconductor device.
Figure 16:
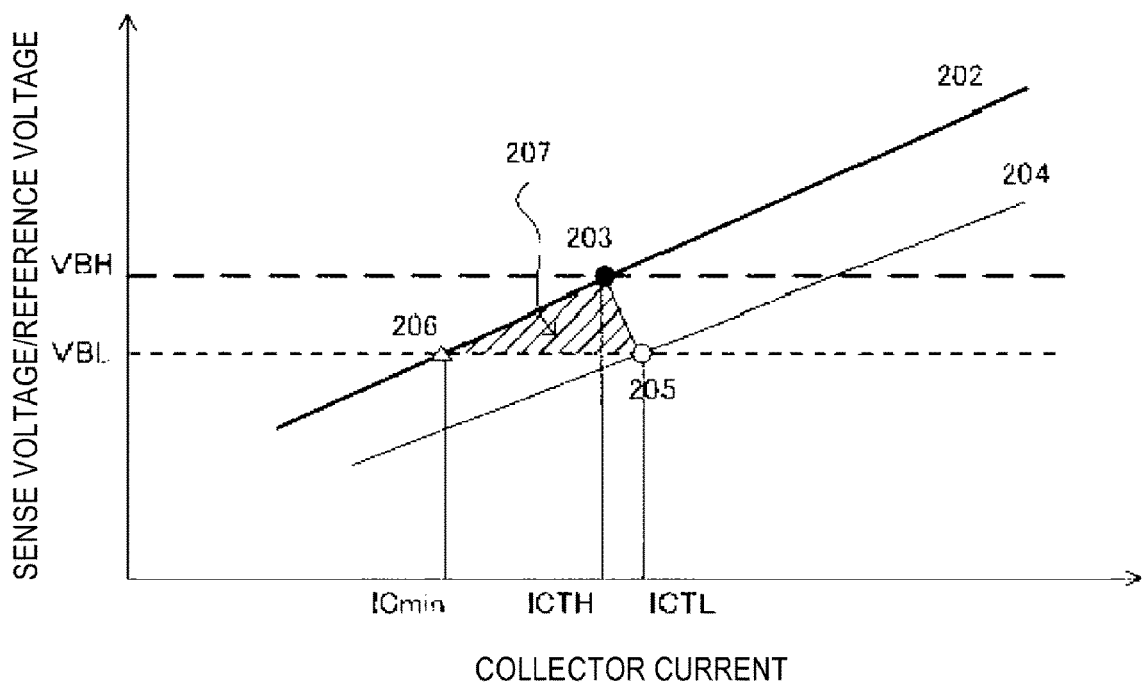
FIG. 16 is a view illustrating a redundant region of an overcurrent protection operation of the power semiconductor device of the related art.

A second embodiment of power semiconductor devices according to embodiments of the present invention includes a control circuit 1, a switching element 2a, and a diode 8 for switching-element temperature detection as shown in FIG. 14. In the present embodiment, an example in which a MOSFET is used as the switching element 2a is shown. The switching element 2a and the diode 8 for switching-element temperature detection may be integrally formed as one chip, or may be provided in the same circuit board or in the same resin case, or the diode for switching-element temperature detection may be provided at a position where it can measure the temperature of the switching element, in the vicinity of the resin case in which the switching element 2a is formed. Herein, the circuit board is an insulating substrate having a predetermined circuit pattern and having electronic components mounted thereon.

The control circuit 1 includes a diode 3 for control circuit temperature detection, an overcurrent reference voltage correction circuit 4, an overcurrent reference voltage circuit 5, an overcurrent detection comparator 6, a sense voltage detection resistor 7, an overheat detection comparator 9, an overheat reference voltage circuit 10, constant-current sources 11 and 12, and a filter 13. The control circuit 1 and the diode 3 for control circuit temperature detection may be integrally formed as one chip, or may be provided in the same circuit board or in the same resin case, or the diode for control circuit temperature detection may be provided at a position where it can measure the temperature of the control circuit, in the vicinity of the resin case in which the control circuit 1 is formed.

The control circuit 1 is connected to the switching element 2a as shown in FIG. 14. The switching element 2 includes a current sensing element arranged in parallel to a MOSFET through which a main current flows. The control circuit 1 has an output terminal OUT for outputting a gate voltage, an overcurrent detection terminal OC, and an overheat detection terminal OH. The drain terminal of the switching element 2a is connected to the ground potential. The control circuit 1 and the switching element 2a include the diode 3 for control circuit temperature detection and the diode 8 for switching-element temperature detection, and may be formed in the same resin case, or may be formed separately.

The output terminal OUT is connected to the gate terminal of the switching element 2a, and the overcurrent detection terminal OC is connected to the source terminal of the switching element 2a.

In the control circuit 1, the overheat detection terminal OH is connected to the constant-current source 11, the inverting input terminal of the overheat detection comparator 9, and the overcurrent reference voltage correction circuit 4, and the non-inverting input terminal of the overheat detection comparator 9 is connected to the overheat reference voltage circuit 10. The overheat detection terminal OH is also connected to the anode terminal of the diode 8 for switching-element temperature detection provided in the switching element 2a, and the cathode terminal of the diode 8 for switching-element temperature detection is connected to the ground potential of the control circuit 1.

A constant current produced by the constant-current source 11 always flows into the diode 8 for switching-element temperature detection, so forward voltage corresponding to the chip temperature of the switching element 2a is applied to the inverting input terminal of the overheat detection comparator 9. Herein, it is assumed that the diode 8 for switching-element temperature detection has a negative temperature characteristic, and the overheat reference voltage circuit 10 outputs an overheat reference voltage VOH1 corresponding to the temperature TH. In this case, the overheat detection comparator 9 outputs a low-level protection operation signal when the chip temperature is lower than TH, and outputs a high-level protection operation signal if the chip temperature becomes a temperature equal to or higher than TH. If this high-level protection operation signal is output, the control circuit 1 outputs an alarm signal from an alarm output circuit and simultaneously performs control to turn off the switching element 2a.

In the control circuit 1, the overcurrent detection terminal OC is connected to the sense voltage detection resistor 7 and the inverting input terminal of the overcurrent detection comparator 6, and the non-inverting input terminal of the overcurrent detection comparator 6 is connected to the overcurrent reference voltage correction circuit 4. The output part of the overcurrent detection comparator 6 is connected to the input part of the filter 13, such that voltages other than a voltage proportional to the collector current is removed.

A constant current produced by the constant-current source 12 always flows into the diode 3 for control circuit temperature detection, so forward voltage corresponding to the temperature of the control circuit 1 is applied as VF2 to the overcurrent reference voltage correction circuit 4.

The overcurrent reference voltage correction circuit 4 calculates a correction value VOCa for correcting an overcurrent reference voltage VOCo to be output from the overcurrent reference voltage circuit 5, on the basis of a signal VF1 obtained by the diode 8 for switching-element temperature detection and a signal VF2 obtained by the above-mentioned diode 3 for control circuit temperature detection, and transmits a corrected overcurrent reference voltage VOC to the non-inverting input of the overcurrent detection comparator 6.

The overcurrent detection comparator 6 compares the source voltage of the switching element 2a with the overcurrent reference voltage VOC, and transmits a protection operation signal.

Figure 2:
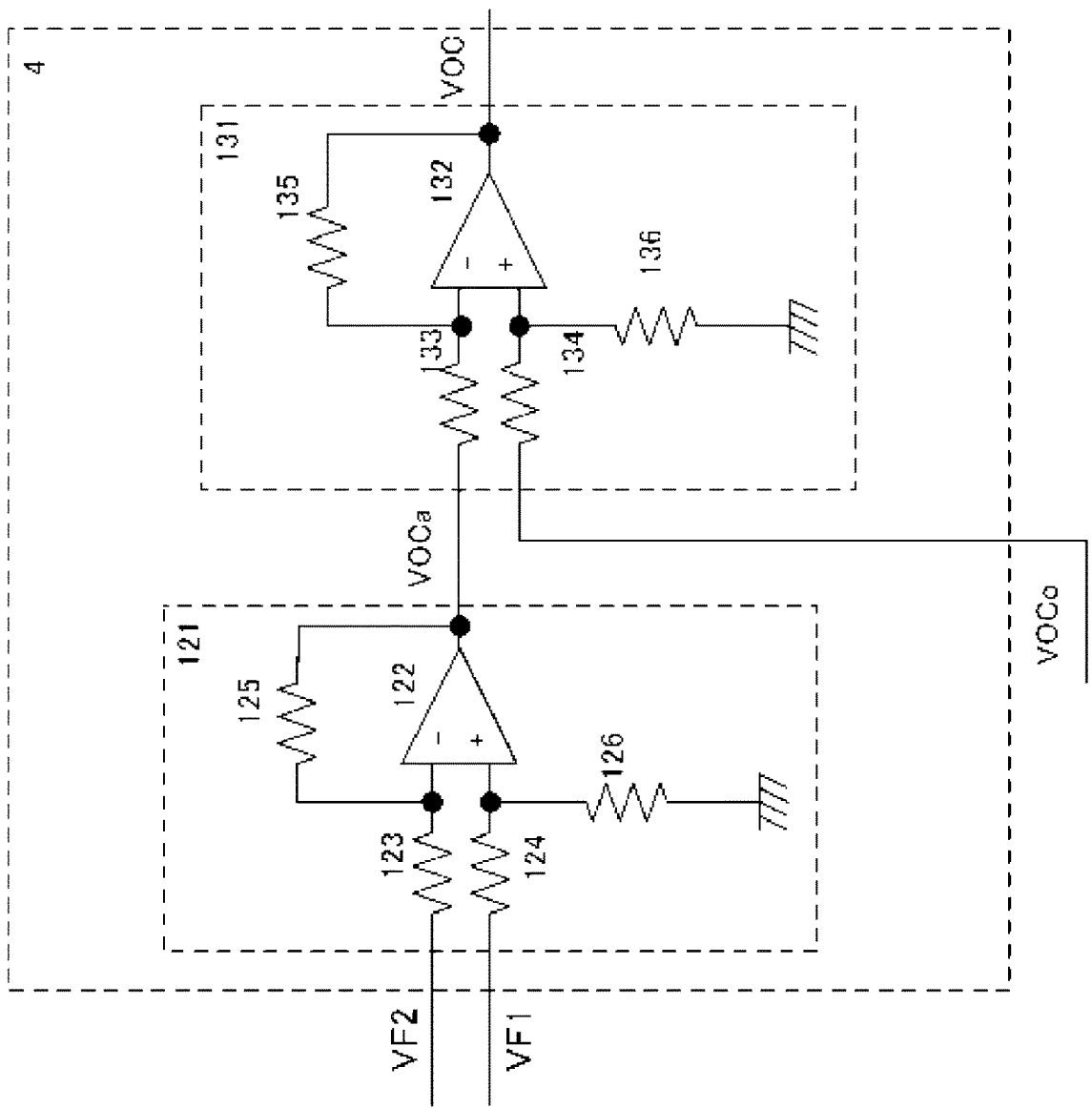
FIG. 2 is a circuit diagram illustrating a first example of an overcurrent reference voltage correction circuit of the present invention.

FIG. 2 shows a first example of the overcurrent reference voltage correction circuit 4 of the present invention. The overcurrent reference voltage correction circuit is composed of differential amplifier circuits 121 and 131 arranged in two stages, and the first differential amplifier circuit 121 is composed of a comparator 122 and resistors 123 to 126, and has VF2 as an inverting input, and has VF1 as an non-inverting input, and outputs a correction value VOCa for correcting an overcurrent reference voltage VOCo, and the second differential amplifier circuit 131 is composed of a comparator 132 and resistors 133 to 136, and has VOCa as an inverting input, and has an uncorrected overcurrent reference voltage VOCo as an non-inverting input, and outputs a corrected overcurrent reference voltage VOC.

Since the diodes have the negative temperature characteristics, as the temperature of the switching element drops, the VF1 and the VF2 become higher.

In the first differential amplifier circuit 121, VF1−VF2 is calculated as a correction value VOCa, and in the second differential amplifier circuit 131, VOCo−VOCa, i.e. VOCo+VF2−VF1 is output as a corrected overcurrent reference voltage VOC.

The uncorrected overcurrent reference voltage VOCo of the control circuit has a positive temperature characteristic, and becomes higher as the temperature of the control circuit rises and becomes lower as the temperature of the control circuit drops.

FIG. 3 shows an example of the relation between the temperatures of the switching element and the control circuit, and VF1, VF2, and VOCa output values in the first example of the overcurrent reference voltage correction circuit 4, and FIG. 4 shows an example of the relation of VOCo and VOC in addition to them. As for the numeric values shown in the drawings, Celsius temperature is assumed as the unit for T1 and T2, and V is assumed as the unit for VF1, VF2, VOCa, VOCo, and VOC, and it is assumed that the resistance values of resistors 122 and 123 are the same, and VF1 is (150−T1)×10, and VF2 is (150−T2)×10, and the voltage of a power source 124 is 750 V, and VCC is 1500 V, and VF0 is 1500 V, and VOCo is T1×8. However, this is just one example. In the drawings, when T1 is equal to T2, the correction value VOCa is 0; however, if T1 becomes higher than T2, as the difference between T1 and T2 increases, a negative value having a larger absolute value is output, and VOCa is subtracted from VOCo having lowered due to the influence of the low temperature T2 of the control circuit, such that the overcurrent reference voltage VOC is set to a value substantially depending only on the temperature of the switching element.

Figure 5:
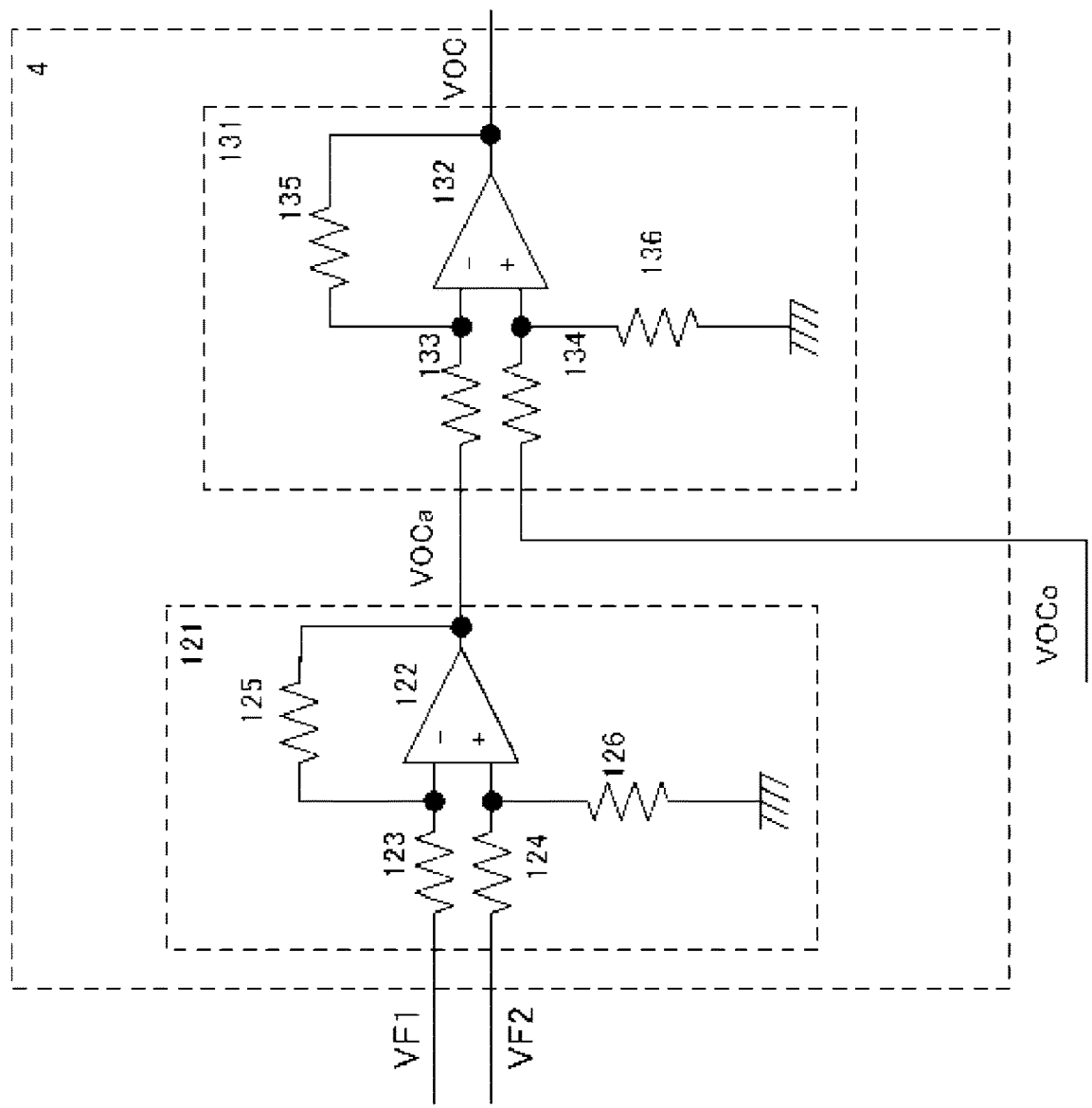
FIG. 5 shows a second example of the overcurrent reference voltage correction circuit of the present invention.

FIG. 5 shows a second example of the overcurrent reference voltage correction circuit 4 of the present invention. This is obtained by assuming the case where the temperature detection means have positive temperature characteristics and reversing the inputs VF1 and VF2 with respect to the first differential amplifier circuit 121 of the first example.

In the first differential amplifier circuit 121, VF2−VF1 is calculated as a correction value VOCa, and in the second differential amplifier circuit 131, VOCo−VOCa, i.e. VOCo+VF1−VF2 is output as a corrected overcurrent reference voltage VOC, and if T1 becomes higher than T2, as the difference between T1 and T2 increases, a negative value having a larger absolute value is output as a correction value VOCa, such that the overcurrent reference voltage VOC is set to a value substantially depending only on the switching element.

Figure 6:
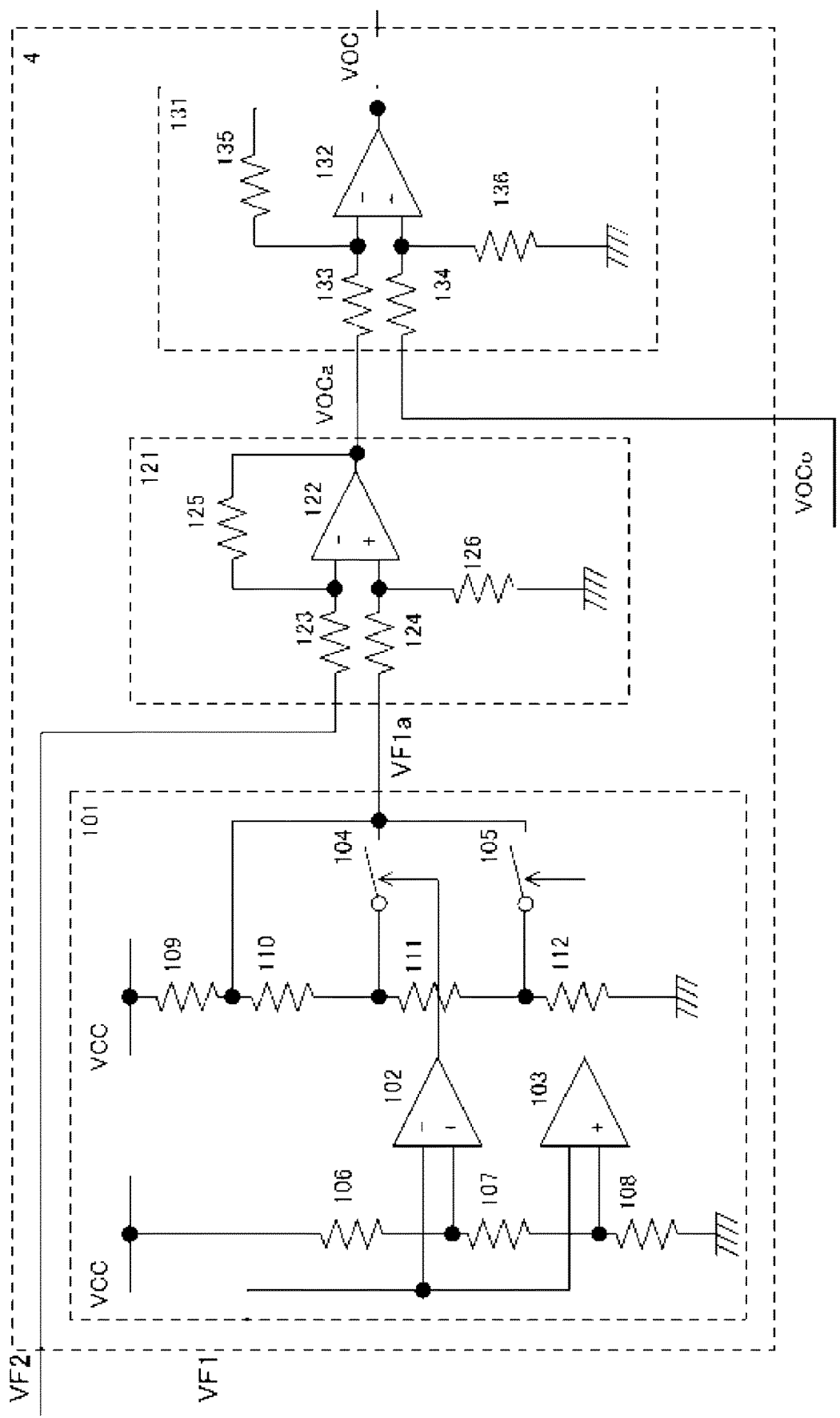
FIG. 6 shows a third example of the overcurrent reference voltage correction circuit of the present invention.

FIG. 6 shows a third example of the overcurrent reference voltage correction circuit 4 of the present invention. The third example is obtained by inserting a digitizing circuit 101 into the inverting input side of the first differential amplifier circuit 121 of the first example of the overcurrent reference voltage correction circuit 4, and the digitizing circuit 101 performs digitization on an input value in a plurality of stages, and outputs the digitized value, and the digitizing circuit 101 of FIG. 6 is for performing digitization in three stages. However, the number of stages for digitization is not limited to three.

The digitizing circuit 101 is composed of two comparators 102 and 103 which have a signal from VF1 as their inverting input and have two kinds of reference potentials as their non-inverting inputs, two switches 104 and 105 for three kinds of potentials, three upstream-side resistors 106 to 108, and four downstream-side resistors 109 to 112, and outputs a potential VF1a which is obtained from the resistors 109 to 112.

To the non-inverting input terminals of the comparators 102 and 103 of the digitizing circuit 101, VF1 is input. The resistors 106, 107, and 108 are connected in series with potential VCC in this order, and one end of the resistor 108 which is not connected to the resistor 107 is grounded. The non-inverting input terminal of the comparator 102 is connected between the resistor 106 and the resistor 107, and the non-inverting input terminal of the comparator 103 is connected between the resistor 107 and the resistor 108.

The resistors 109, 110, 111, and 112 are connected in series with the potential VCC in this order, and one end of the resistor 112 which is not connected to the resistor 111 is grounded.

The switch 104 is connected to the contact point of the resistor 110 and the resistor 111, and the switch 104 is turned on and off according to whether the output signal of the comparator 102 represents "true" or "false". The switch 105 is connected to the contact point of the resistor 111 and the resistor 112, and the switch 105 is turned on and off according to whether the output signal of the comparator 103 represents "true" or "false".

The other ends of the switches 104 and 105 are connected to the contact point of the resistor 109 and the resistor 110, and VF1a is output to the first differential amplifier circuit 121.

In the comparators 102 and 103, VF1 is compared with the overcurrent reference voltages generated by the resistors 106 to 108, and the switch 104 is turned on and off according to whether the output signal of the comparator 102 represents "true" or "false", and the switch 105 is turned on and off according to whether the output of the comparator 103 represents "true" or "false".

In the case where the temperature of the switching element is in a standard range, VF1 becomes a high value, and a value representing "false" is output from both of the comparators 102 and 103, and the switches 104 and 105 are turned off, and a high potential which is obtained between the resistors 109 and 110 in the serial connection of the resistors 109 to 112 is output as VF1a.

However, in the case where the temperature of the switching element is slightly higher than the standard range, a value representing "true" is output from the comparator 102, and the value representing "false" is output from the comparator 103, whereby the switch 104 is turned on, and the a slightly high potential which is obtained between the resistors 109 and 111 in the serial connection of the resistors 109, 111, and 112 is output as VF1a.

Further, in the case where the temperature of the switching element is higher than the standard range, VF1 becomes a low value, whereby the value representing "true" is output from both of the comparators 102 and 103. Therefore, the switches 104 and 105 are turned on, and a higher potential which is obtained between the resistors 109 and 112 in the serial connection of the resistors 109 to 112 is output as VF1a.

In the first differential amplifier circuit 121, VF1a-VF2 is calculated as a correction value VOCa, and in the second differential amplifier circuit 131, VOCo-VOCa, i.e. VOCo+VF2-VF1a is output as a corrected overcurrent reference voltage VOC.

FIG. 7 shows an example of the relation of the temperatures between the temperatures of the switching element and the control circuit, and VF1, VF2, VF1a, and VOCa output values in the third example of the overcurrent reference voltage correction circuit 4, and FIG. 8 shows an example of the relation of VOCo and VOC in addition to them. As for the numeric values shown in the drawings, Celsius temperature is assumed as the unit for T1 and T2, and V is assumed as the unit for VF1, VF2, VF1a, VOCa, VOCo, and VOC, and it is assumed that the resistance values R106 to R112 of resistors 106 to 112 satisfies the relation in which the resistance values R106, R107, and R108 are the same, and the resistance values R123, R124, R125, and R126 are the same, and the resistance values R133, R134, R135, and R136 are the same, and the ratio of the resistance values R109, R110, R111, and R112 is 1:4:20:5, and VF1 is $(150-T1) \times 10$, and VF2 is $(150-T2) \times 10$, and VCC is 1500 V, and VF0 is 1500 V, and VOCo is $T1 \times 8$. However, this is just one example. In the drawing, with respect to three stages in which T1 is in a range lower than 50° C., a range equal to or higher than 50° C. and lower than 100° C., and a range higher than 100° C., respectively, i.e. three stages in which VF1 is in a range exceeding 1000 V, a range exceeding 500 V and lower than 1000 V, and a range lower than 500 V, respectively, 250 W, 750 W, and 1250 W are output as VF1a, respectively, and the correction value VOCa for the overcurrent reference voltage VOC is close to 0 when T1 is close to T2; however, if T1 becomes higher than T2, as the difference between T1 and T2 increases, a negative value having a larger absolute value as T1 is output, and VOCa is subtracted from VOCo lowered by the influence of the low temperature T2 of the control circuit, such that the overcurrent reference voltage VOC is set to a value substantially depending only on the temperature of the switching element.

While the first example and the second example treat VF1 and VF2 as continuous analog values, the third example treats the inverting input VF1a of the first differential amplifier circuit 121 as discrete numeric values of a plurality of stages, i.e. a standard stage, a slightly high stage, and a high stage, whereby the correction value VOCa for the overcurrent reference voltage and the overcurrent reference voltage VOC which are outputs also become slightly discrete values.

The digitizing circuit 101 may be connected to the non-inverting input side of the first differential amplifier circuit 121, or may be connected to the output side of the second differential amplifier circuit 131, or a plurality of digitizing circuits may be combined in the same way. Similarly, even in the case where the means for detecting the temperatures of the switching element and the control circuit have positive temperature characteristics, the same connection may be performed.

Figure 9:
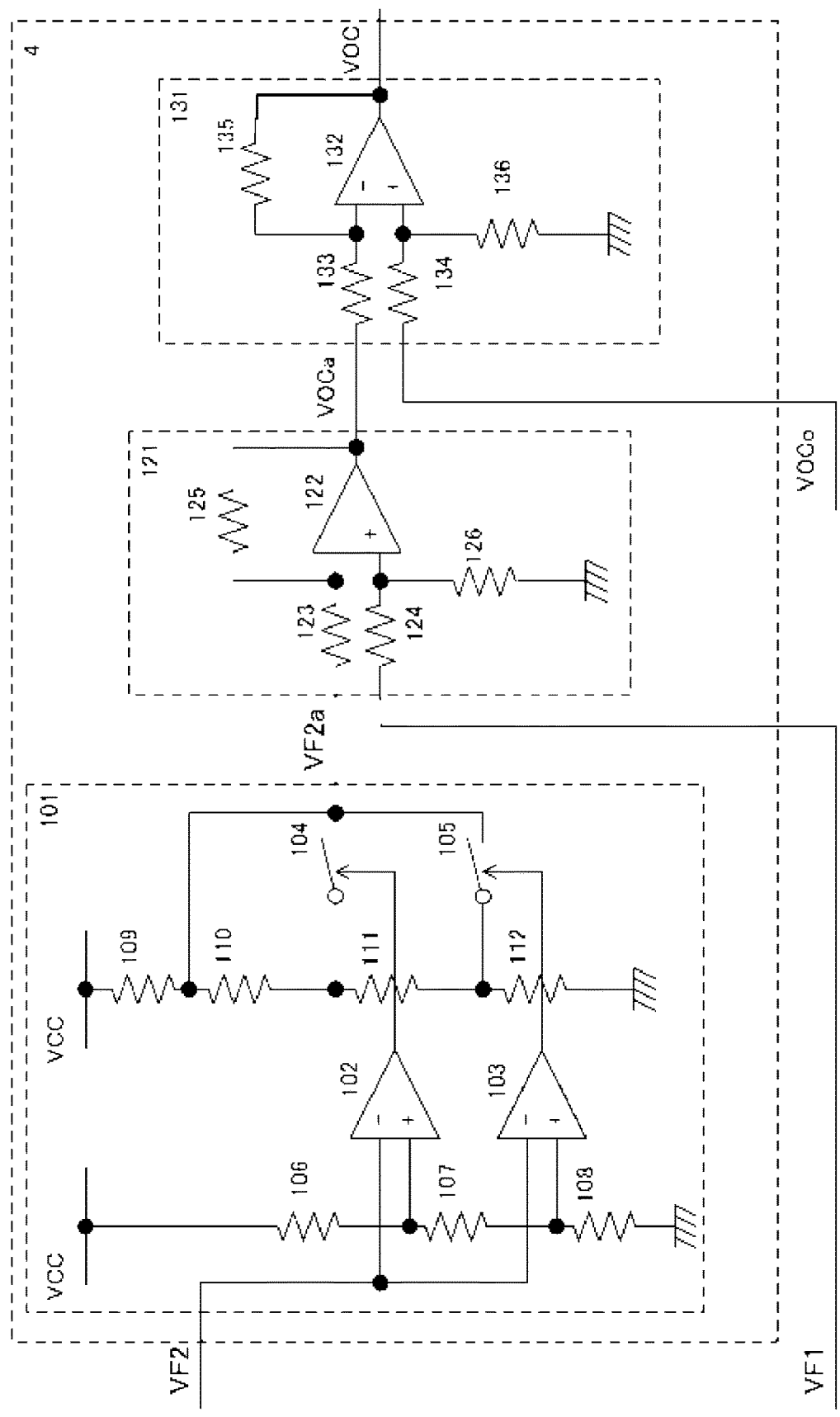
FIG. 9 is a circuit diagram illustrating a fourth example of the overcurrent reference voltage correction circuit of the present invention.

FIG. 9 shows an example in which a digitizing circuit 101 has been inserted on the non-inverting input side of the differential amplifier circuit 121, as a fourth example of the overcurrent reference voltage correction circuit 4. In the present example, the digitizing circuit 101 has VF2 as an input value, and has a value VF2a which is obtained by digitizing the input value as an output value, and inputs VF1 and VF2a to the inverting input side and non-inverting input side of the first differential amplifier circuit 121, respectively.

Figure 10:
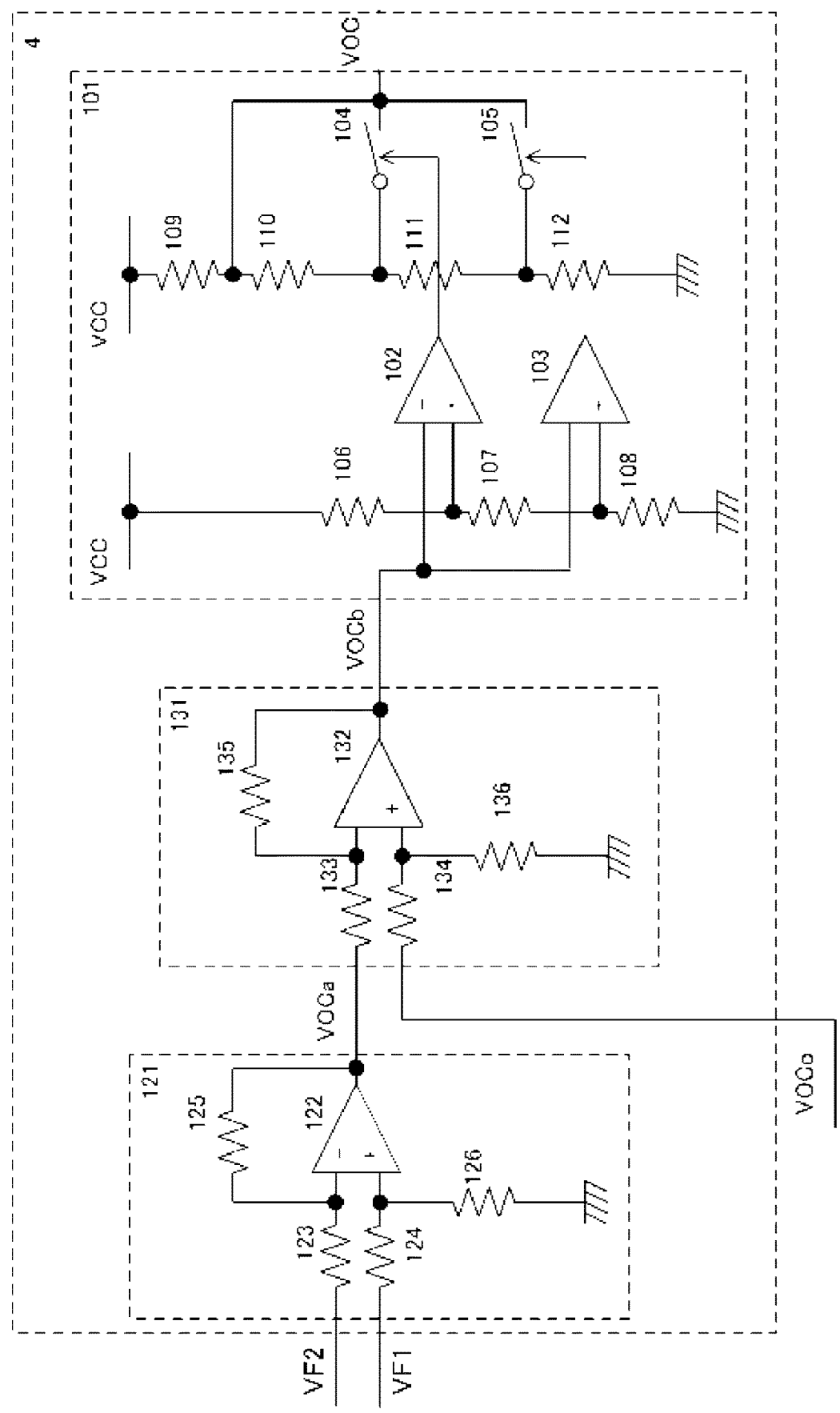
FIG. 10 is a circuit diagram illustrating a fifth example of the overcurrent reference voltage correction circuit of the present invention.
Figure 13:
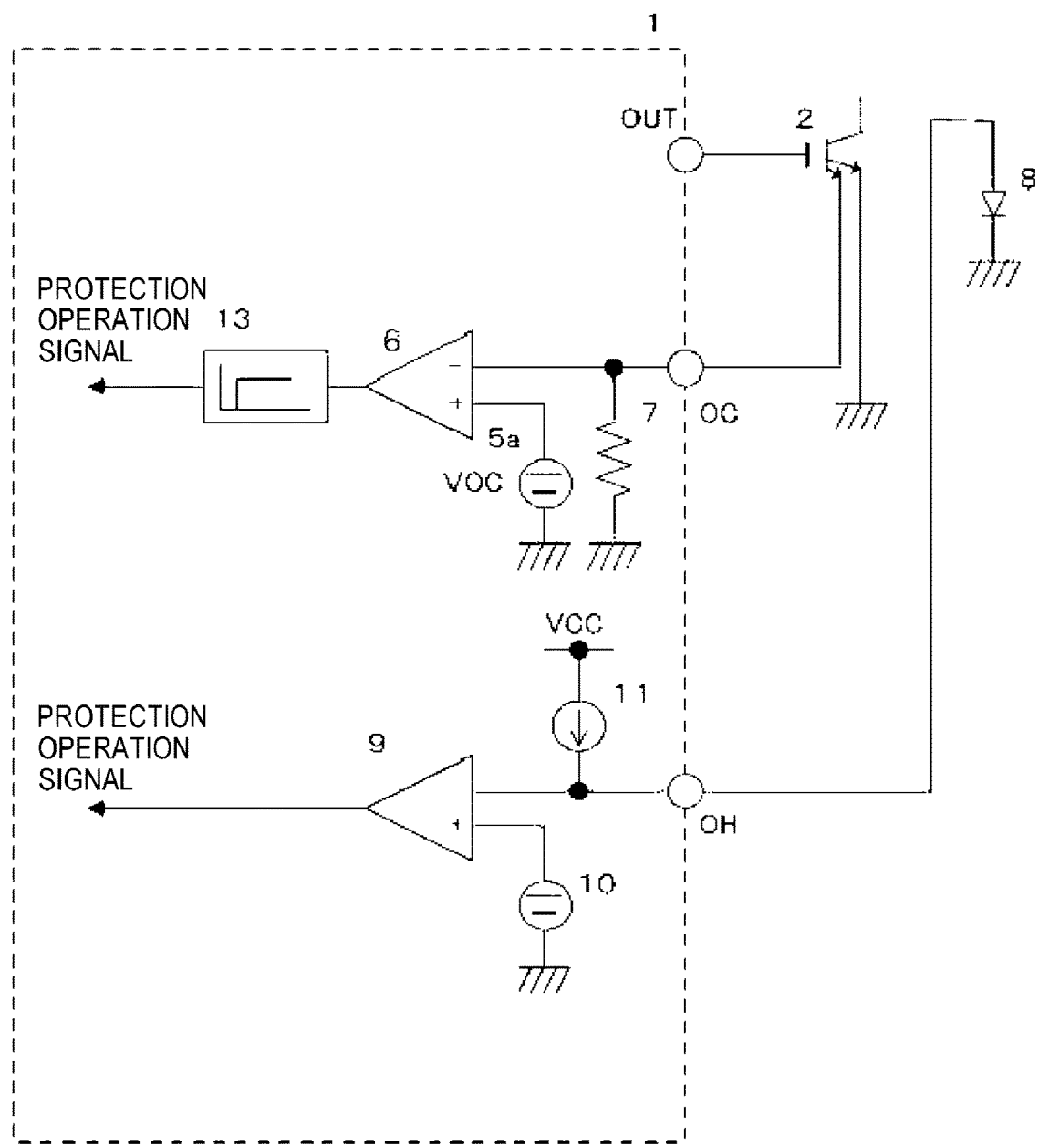
FIG. 13 is a block diagram illustrating an example of a power semiconductor device of the related art.

FIG. 10 shows an example in which a digitizing circuit 101 has been inserted on the output side of a differential amplifier circuit 122, as a fifth example of the overcurrent reference voltage correction circuit 4. In the fifth example, the digitizing circuit 101 has the output voltage VOCb of the second differential amplifier circuit 131 as an input value and has a value VOC which is obtained by digitizing the input value as an output value.

Even in the case where a so-called overcurrent protection insufficiency range occurs, such as the case where the temperature of the control circuit is extremely higher than the temperature of the switching element, i.e. the case where the overcurrent detection value becomes a value higher than a value originally required in the related art and thus protection is not performed in a current range in which protection is required, all of these overcurrent reference voltage correction circuits 4 can narrow the overcurrent protection insufficiency range.

FIGS. 11 and 12 shows an example of the relation between the temperatures T1 and T2, and VOCa, and VOC in the case where the means for detecting the temperatures of the switching element and the control circuit have negative temperature characteristics, i.e. the first example of the overcurrent reference voltage correction circuit 4. They are expansions of the display ranges of FIG. 3 and FIG. 4 to the range in which T2 is higher than T1, and definition of each value is the same as that in the above-mentioned first embodiment of the circuit. As shown in the drawings, for example, even in the case where the temperature of the control circuit is higher than the temperature of the switching element, VOC to be output by the above-mentioned circuit becomes a value substantially depending only on the temperature of the switching element.

Figure 17:
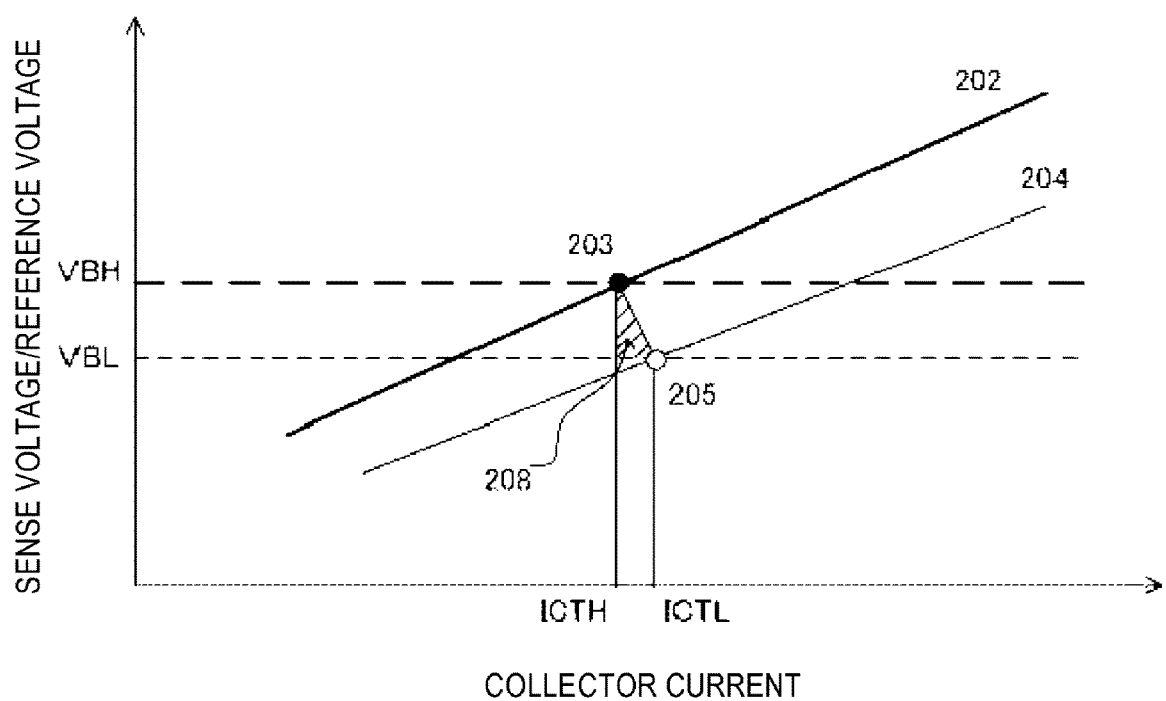
FIG. 17 is a view illustrating a redundant region of the overcurrent protection operation of the power semiconductor device according to the embodiment of the present invention.
Figure 18:
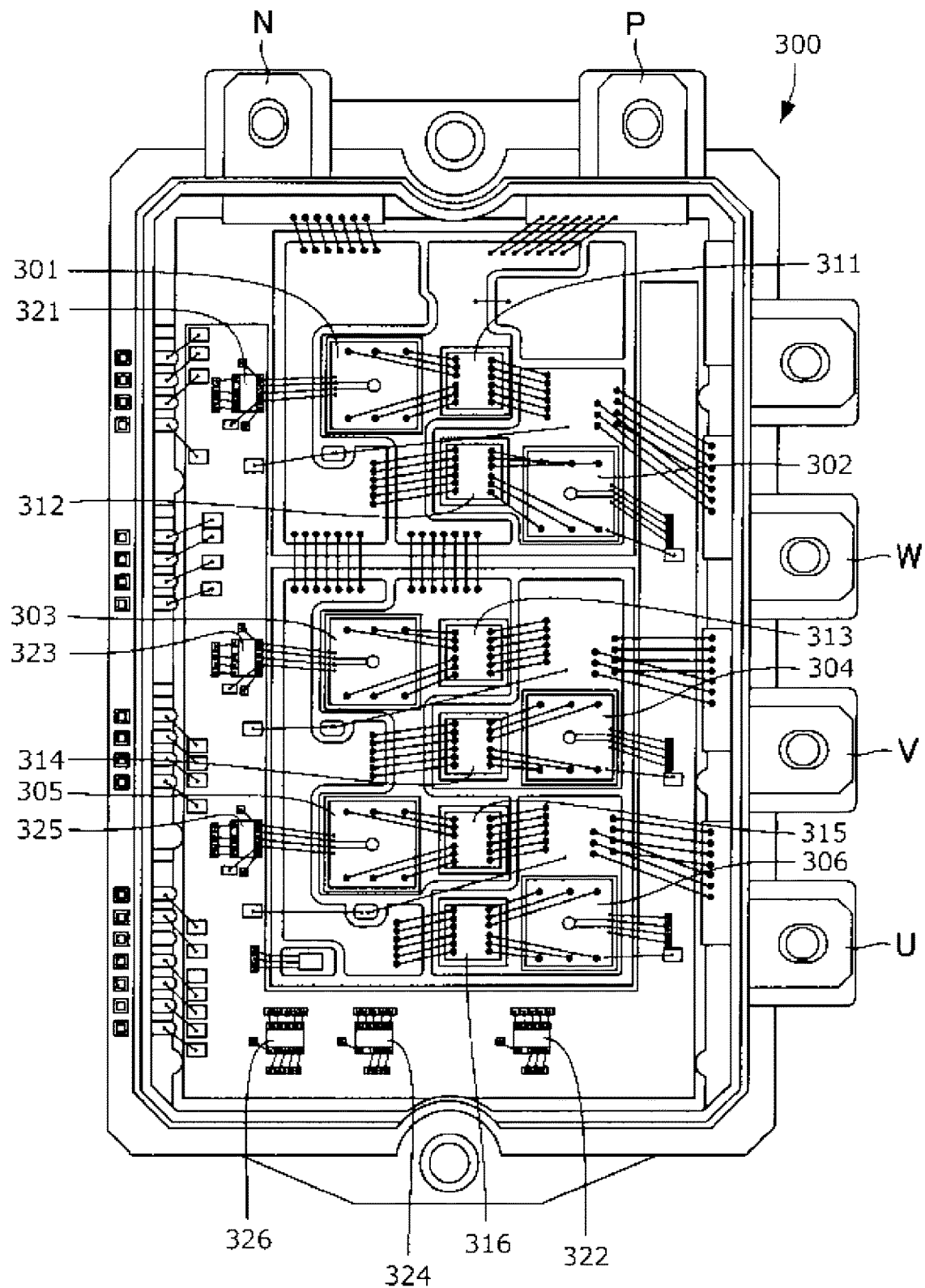
FIG. 18 is a view illustrating an example of the internal structure of a switching element module (IPM) of the related art.
Figure 19:
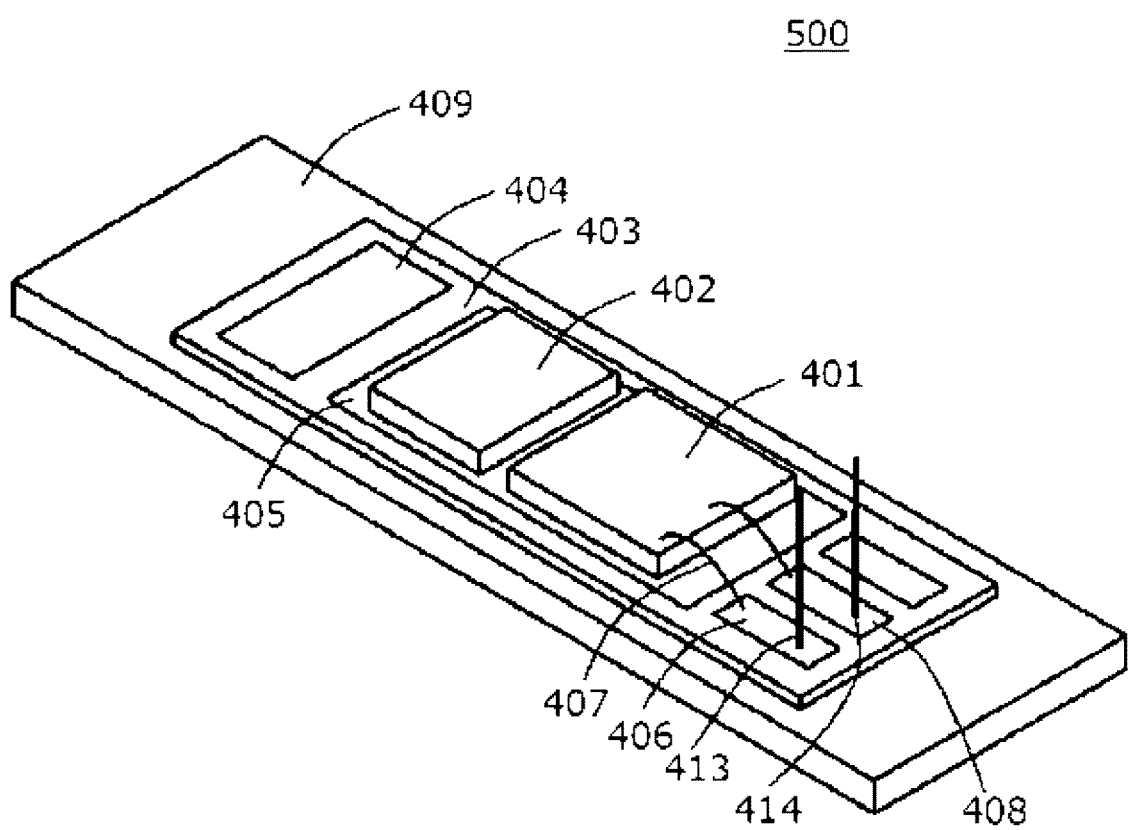
FIG. 19 is a view illustrating an example of the internal structure of a semiconductor element module of the related art in which a switching element and a control circuit are separated.
Figure 20:
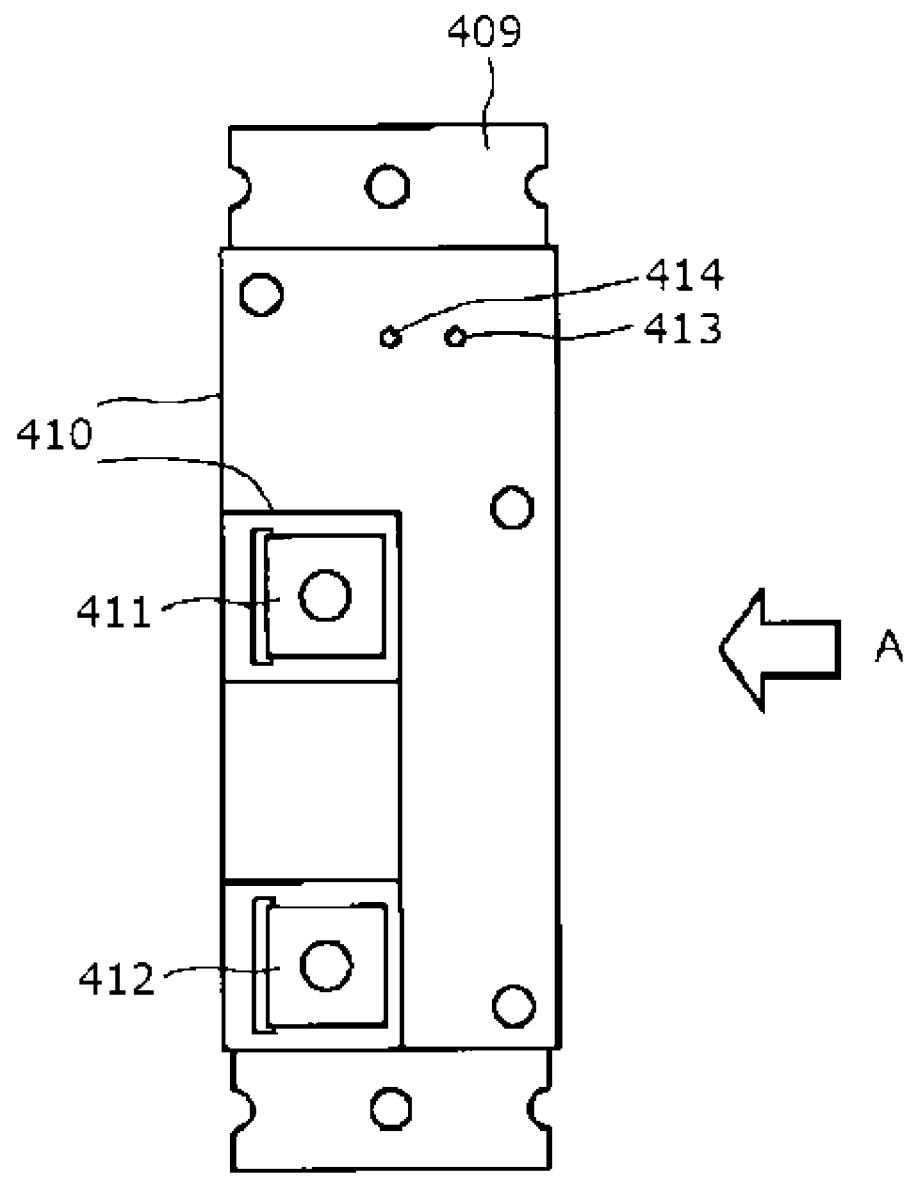
FIG. 20 is a view illustrating the example of the internal structure of the semiconductor element module of the related art in which the switching element and the control circuit are separated.
Figure 21:
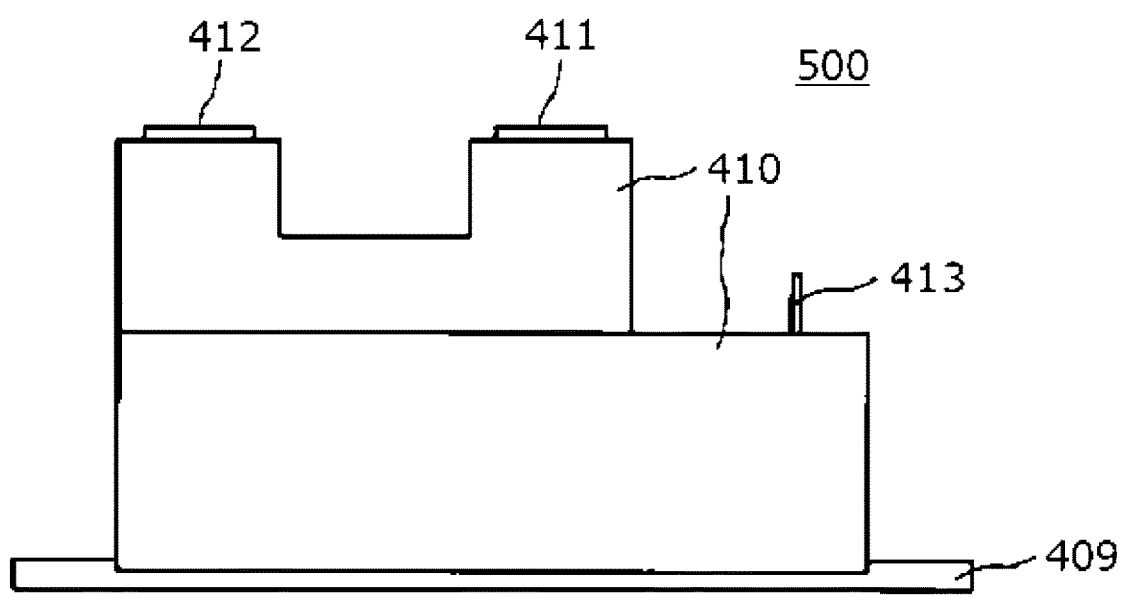
FIG. 21 is a view illustrating the example of the internal structure of the semiconductor element module of the related art in which the switching element and the control circuit are separated.
Figure 22:
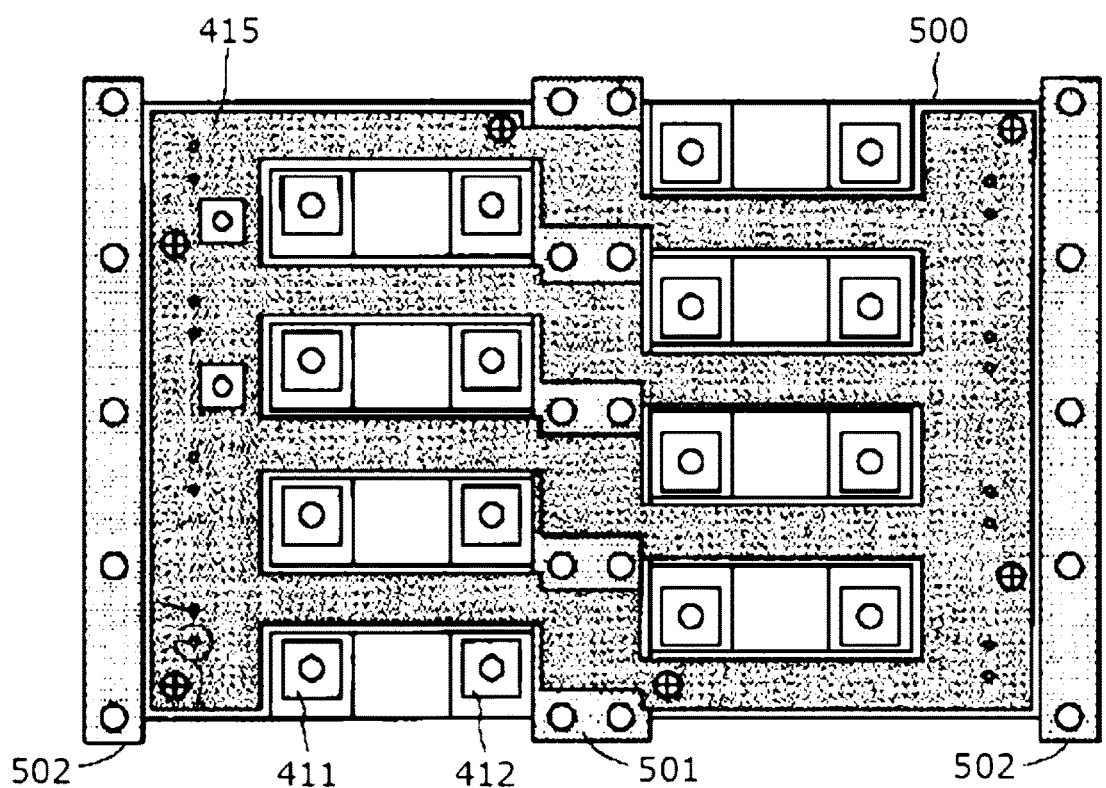
FIG. 22 is a view illustrating an example of a module unit of the related art in which switching elements and control circuits are separated.
Figure 23:
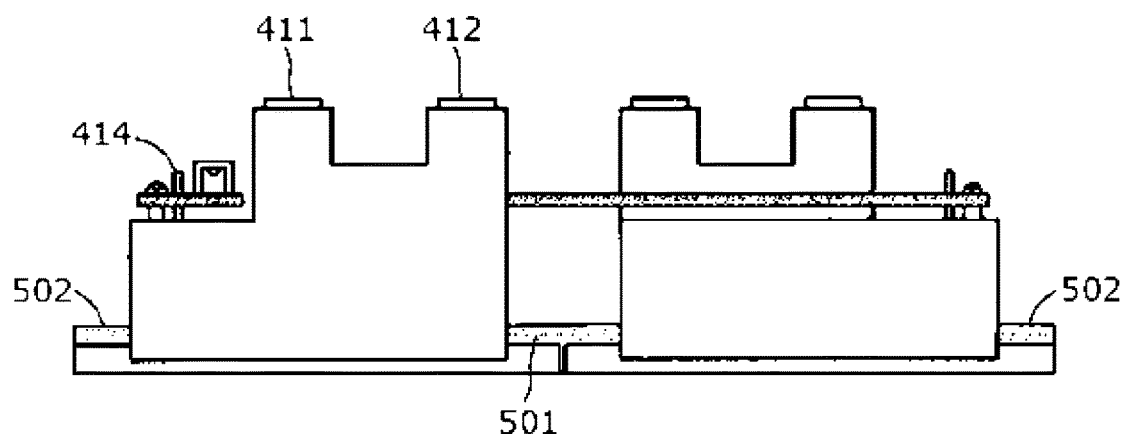
FIG. 23 is a view illustrating the example of the module unit of the related art in which the switching elements and the control circuits are separated.
Figure 24:
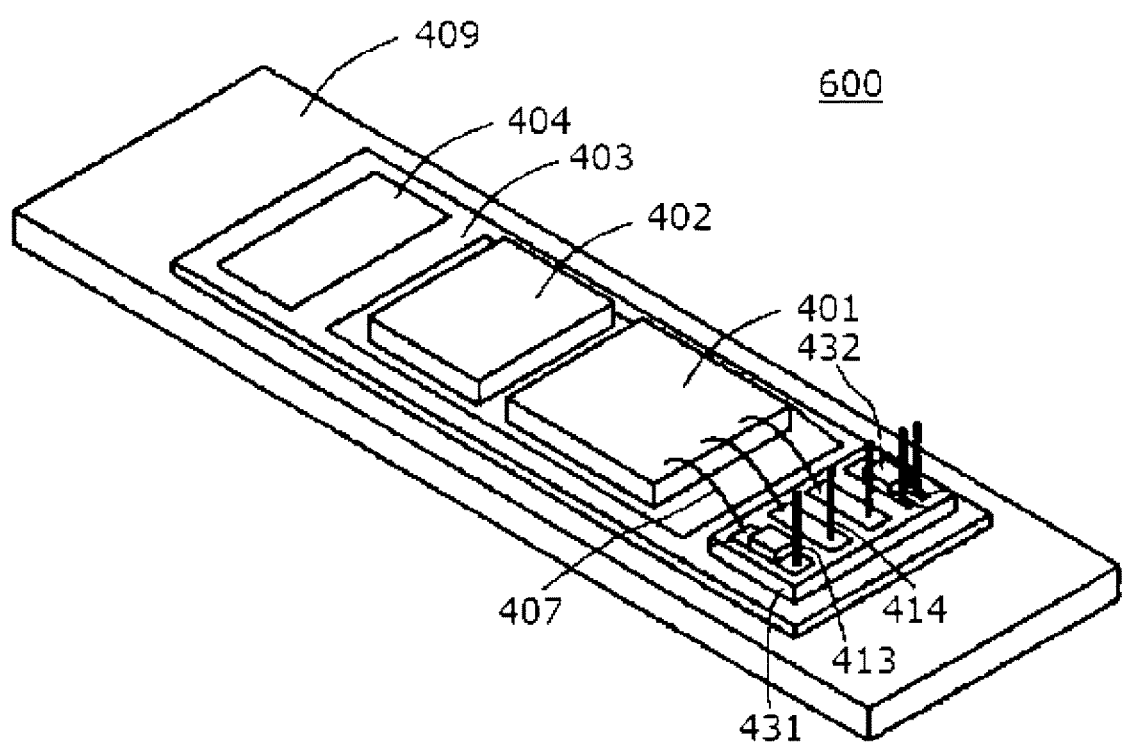
FIG. 24 is a view illustrating an example of the internal structure of a semiconductor element module of the related art in which a semiconductor element and a control circuit are separated and which includes a temperature detector.

The overcurrent protection operation region of the power semiconductor device of the present invention according to the first example of the overcurrent reference voltage correction circuit 4 is shown in FIG. 17. Further, the maximum value and minimum value of operating temperature assumed for the power semiconductor device are denoted by TH and TL.

For example, in the case where the temperature of the switching element is TH and the temperature of the control circuit is TL, the intersection 203 of the sense voltage 202 and the overcurrent reference voltage VBH, i.e. a collector current ICTH becomes an overcurrent value, and the redundant range becomes narrow as shown by a reference symbol "208".

What is claimed is:
1. A semiconductor device comprising:
a switching element;
a switching element control circuit configured to control the switching element and including an overcurrent detection circuit;
a first temperature detector to detect the temperature of the switching element and to output a first detection value; and
a second temperature detector to detect the temperature of the switching element control circuit and to output a second detection value,
the switching element control circuit including a reference correction circuit to correct an overcurrent reference value of the overcurrent detection circuit on the basis of the first detection value and the second detection value and to output a corrected overcurrent reference value.

2. The semiconductor device according to claim 1, wherein the reference correction circuit corrects the overcurrent reference value on the basis of the first detection value, based on the difference between the temperature of the switching element and the temperature of the switching element control circuit being equal to or larger than a predetermined value.

3. The semiconductor device according to claim 1, wherein the switching element is mounted on a first circuit board which is formed of an insulating substrate having a predetermined circuit pattern and having electronic components mounted thereon.

4. The semiconductor device according to claim 3, wherein the switching element control circuit is mounted on a second circuit board which is formed of an insulating substrate having a predetermined circuit pattern and having electronic components mounted thereon.

5. The semiconductor device according to claim 1, wherein the switching element and the switching element control circuit are mounted on a same circuit board which is formed of an insulating substrate having a predetermined circuit pattern and having electronic components mounted thereon.

6. The semiconductor device according to claim 1, further comprising a first resin case formed to cover the switching element.

7. The semiconductor device according to claim 6, wherein further comprising a second resin case formed to cover the switching element control circuit.

8. The semiconductor device according to claim 1, further comprising a resin case formed to cover the switching element and the switching element control circuit.

9. The semiconductor device according to claim 1, wherein the first temperature detector is provided together with the switching element in the same element, or is provided at a position where it can measure the temperature of the switching element, on a circuit board or in a resin case or in the vicinity of the resin case.

10. The semiconductor device according to claim 1, wherein the second temperature detector is provided together with the switching element control circuit in the same element, or is provided at a position where it can measure the temperature of the switching element control circuit, on a circuit board or in a resin case or in the vicinity of the resin case.

11. The semiconductor device according to claim 1, wherein an IGBT is used as the switching element.

12. The semiconductor device according to claim 1, wherein a MOSFET is used as the switching element.

13. The semiconductor device according to claim 1, wherein the first and second temperature detectors are configured to have negative temperature characteristics.

14. The semiconductor device according to claim 1, wherein the first and second temperature detectors are configured to have positive temperature characteristics.

15. The semiconductor device according to claim 1, wherein the reference correction circuit includes a digitizing circuit to perform digitization on an input value in a plurality of stages according to the magnitude of the input value and outputting the digitized value.

16. The semiconductor device according to claim 15, wherein the output side of the digitizing circuit is connected to the first detection value input side of the reference correction circuit.

17. The semiconductor device according to claim 1, wherein inputs of the overcurrent detection circuit include a current detection value based on the current flowing in the switching element and a corrected overcurrent reference value, and
wherein the overcurrent detection circuit is configured to have a comparing function and a function of outputting a signal based on the result of comparison.

18. An overcurrent protection method of a semiconductor device comprising:
detecting a first detection value based on an output of a first temperature detector detecting a temperature of a switching element;
detecting a second detection value based on an output of a second temperature detector detecting a temperature of a switching element control circuit configured to control the switching element and having an overcurrent detection circuit; and
correcting an original overcurrent reference value of the overcurrent detection circuit on the basis of the first detection value and the second detection value and outputting the corrected overcurrent reference value, by a reference correction circuit provided in the switching element control circuit.

19. The overcurrent protection method of the semiconductor device according to claim 18,
wherein the first and second temperature detectors are configured to have negative temperature characteristics, and
wherein the reference correction circuit calculates an overcurrent reference correction value by subtracting the second detection value from the first detection value, and calculates the corrected overcurrent reference value by subtracting the overcurrent reference correction value from the original overcurrent reference value.

20. The overcurrent protection method of the semiconductor device according to claim 18,
wherein the first and second temperature detectors are configured to have positive temperature characteristics, and
wherein the reference correction circuit calculates an overcurrent reference correction value by subtracting the first detection value from the second detection value, and calculates the corrected overcurrent reference value by subtracting the overcurrent reference correction value from the original overcurrent reference value.

21. The overcurrent protection method of the semiconductor device according to claim 18,
wherein the reference correction circuit includes a digitizing circuit for performing digitization on an input value in a plurality of stages according to the magnitude of the input value, and
wherein the digitizing circuit is configured to digitize any one of the first detection value, the second detection value, and the corrected overcurrent reference value, or two or more of them.

22. The overcurrent protection method of the semiconductor device according to claim 18, further comprising detecting an occurrence of the overcurrent by comparing a current detection value based on the current flowing in the switching element with the overcurrent reference value,
wherein in the detecting, when the current detection value exceeds the overcurrent reference value, occurrence of the overcurrent is detected.

23. A semiconductor device comprising:

a switching element;

a switching element control circuit configured to control the switching element and including an overcurrent detection circuit;

a first temperature detector to detect the temperature of the switching element and to output a first detection value; and a second temperature detector to detect the temperature of the switching element control circuit and to output a second detection value, the switching element control circuit including a reference correction circuit to correct an overcurrent reference value of the overcurrent detection circuit on the basis of the first detection value and the second detection value and to output a corrected overcurrent reference value, wherein the reference correction circuit includes a digitizing circuit to perform digitization on an input value in a plurality of stages according to the magnitude of the input value and outputting the digitized value, and wherein the output side of the digitizing circuit is connected to the second detection value input side of the reference correction circuit.

24. A semiconductor device comprising:

a switching element;

a switching element control circuit configured to control the switching element and including an overcurrent detection circuit;

a first temperature detector to detect the temperature of the switching element and to output a first detection value; and a second temperature detector to detect the temperature of the switching element control circuit and to output a second detection value, the switching element control circuit including a reference correction circuit to correct an overcurrent reference value of the overcurrent detection circuit on the basis of the first detection value and the second detection value and to output a corrected overcurrent reference value, wherein the reference correction circuit includes a digitizing circuit to perform digitization on an input value in a plurality of stages according to the magnitude of the input value and outputting the digitized value, and wherein the input side of the digitizing circuit is connected to the output side of the reference correction circuit.

* * * * *

UNITED STATES PATENT AND TRADEMARK OFFICE
CERTIFICATE OF CORRECTION

PATENT NO. : 11,594,873 B2
APPLICATION NO. : 17/184816
DATED : February 28, 2023
INVENTOR(S) : Kei Minagawa It is certified that error appears in the above-identified patent and that said Letters Patent is hereby corrected as shown below:

In the Claims

Column 15, Line 29:
In Claim 7, before "further" delete "wherein".

Signed and Sealed this
Eighteenth Day of April, 2023

Katherine Kelly Vidal
Director of the United States Patent and Trademark Office